US012451070B2

(12) United States Patent
Li et al.

(10) Patent No.: US 12,451,070 B2
(45) Date of Patent: Oct. 21, 2025

(54) DISPLAY PANEL, DRIVING METHOD THEREFOR, AND DISPLAY DEVICE

(71) Applicants: Hefei BOE Joint Technology Co., Ltd., Anhui (CN); BOE Technology Group Co., Ltd., Beijing (CN)

(72) Inventors: Yongqian Li, Beijing (CN); Xuehuan Feng, Beijing (CN)

(73) Assignees: HEFEI BOE JOINT TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/686,880

(22) PCT Filed: Mar. 29, 2022

(86) PCT No.: PCT/CN2022/083798
§ 371 (c)(1),
(2) Date: Feb. 27, 2024

(87) PCT Pub. No.: WO2023/184169
PCT Pub. Date: Oct. 5, 2023

(65) Prior Publication Data

US 2025/0131879 A1 Apr. 24, 2025

(51) Int. Cl.
*G09G 3/3233* (2016.01)
*G09G 3/3266* (2016.01)
*G11C 19/28* (2006.01)

(52) U.S. Cl.
CPC ......... *G09G 3/3233* (2013.01); *G09G 3/3266* (2013.01); *G11C 19/28* (2013.01);
(Continued)

(58) Field of Classification Search
CPC ... G09G 2300/0819; G09G 2300/0861; G09G 3/3233
See application file for complete search history.

(56) References Cited

U.S. PATENT DOCUMENTS

2013/0207957 A1* 8/2013 Lin ...................... G09G 3/3241 345/212
2017/0162122 A1 6/2017 In
(Continued)

FOREIGN PATENT DOCUMENTS

CN 110875015 A 3/2020
CN 112116897 A 12/2020
(Continued)

OTHER PUBLICATIONS

CN113903301A Shifting register, scanning driving circuit, Jan. 7, 2022 Feng Xuehuan (Year: 2022).*
(Continued)

*Primary Examiner* — Van N Chow
(74) *Attorney, Agent, or Firm* — XSENSUS LLP

(57) ABSTRACT

Provided are a display panel, a driving method therefor and a display device. The display panel includes pixel driving circuits and a first gate driving circuit. The pixel driving circuit includes a driving circuit connected to first to third nodes for inputting a driving current to the third node through the second node, and a first switching unit having a first terminal connected to the third node and a second terminal connected to a sensing signal terminal for electrically connecting, in response to a signal at a control terminal thereof, the third node and sensing signal terminal. The first gate driving circuit includes a first output terminal corresponding to the pixel driving circuit and connected to the control terminal. The first output terminal outputs an active level pulse during data writing stage and black frame
(Continued)

insertion stage of a driving cycle of the pixel driving circuit corresponding thereto.

19 Claims, 9 Drawing Sheets

(52) U.S. Cl.
CPC ............... *G09G 2300/0408* (2013.01); *G09G 2300/0842* (2013.01); *G09G 2310/0286* (2013.01); *G09G 2310/08* (2013.01); *G09G 2320/0247* (2013.01); *G09G 2320/10* (2013.01)

(56) References Cited

U.S. PATENT DOCUMENTS

| | | | | |
|---|---|---|---|---|
| 2021/0358405 | A1* | 11/2021 | Yang | G09G 3/3233 |
| 2021/0358408 | A1* | 11/2021 | Zhang | G09G 3/3233 |
| 2022/0139312 | A1* | 5/2022 | Bai | G09G 3/3266 345/204 |
| 2022/0180810 | A1* | 6/2022 | Zhang | G09G 3/3241 |
| 2022/0310020 | A1* | 9/2022 | Feng | G11C 19/28 |
| 2023/0154407 | A1* | 5/2023 | Li | G09G 3/3258 345/212 |
| 2024/0135884 | A1* | 4/2024 | Ma | G09G 3/3258 |
| 2024/0212623 | A1* | 6/2024 | Feng | G09G 3/3677 |

FOREIGN PATENT DOCUMENTS

| | | | |
|---|---|---|---|
| CN | 112259032 | A | 1/2021 |
| CN | 112967656 | A | 6/2021 |
| CN | 113345379 | A | 9/2021 |
| CN | 113362772 | A | 9/2021 |
| CN | 113593482 | A | 11/2021 |
| CN | 113781967 | A | 12/2021 |
| CN | 113903301 | A | 1/2022 |
| CN | 114241992 | A | 3/2022 |

OTHER PUBLICATIONS

International Search Report and Written Opinion mailed on Jan. 5, 2023, in corresponding PCT/CN2022/083798, 13 pages.

* cited by examiner

DISPLAY PANEL, DRIVING METHOD THEREFOR, AND DISPLAY DEVICE

CROSS-REFERENCE TO RELATED APPLICATION

The present application is a U.S. National Stage of International Application No. PCT/CN2022/083798 filed on Mar. 29, 2022, the entire contents of which are incorporated herein by reference.

TECHNICAL FIELD

The present disclosure relates to the field of display technology, and in particular, to a display panel and a driving method thereof, and a display device.

BACKGROUND

In the related art, in a dynamic screen switching process of a display panel, image drag (also known as dynamic image drag) may occur, which will easily lead to display panel flicker.

It is to be understood that the above information disclosed in the Background section is only for enhancement of understanding of the background of the present disclosure and therefore it may contain information that does not form the prior art that is already known to a person skilled in the art.

SUMMARY

An aspect of the present disclosure provides a display panel, including: a plurality of pixel driving circuits, including: a driving circuit, connected to a first node, a second node, and a third node, and configured to input, in response to a signal from the first node, a driving current to the third node through the second node, and a first switching unit, having a first terminal connected to the third node and a second terminal connected to a sensing signal terminal, and configured to electrically connect, in response to a signal at a control terminal of the first switching unit, the third node and the sensing signal terminal; and a first gate driving circuit, including a plurality of first output terminals, the first output terminal being provided to correspond to the pixel driving circuit, and being connected to the control terminal of the first switching unit in the pixel driving circuit corresponding to the first output terminal, wherein a driving cycle of the pixel driving circuit includes a data writing stage, a plurality of light-emitting stages, and a black frame insertion stage provided between adjacent light-emitting stages, and the first output terminal is configured to output an active level pulse during the data writing stage and the black frame insertion stage of the pixel driving circuit corresponding to the first output terminal.

In an embodiment of the present disclosure, the driving circuit includes: a driving transistor, having a first electrode connected to the second node, a second electrode connected to the third node, and a gate electrode connected to the first node, the first switching unit includes: a first transistor, having a first electrode connected to the third node, a second electrode connected to the sensing signal terminal, and a gate electrode connected to a first gate driving signal terminal, the pixel driving circuit further includes: a second transistor, having a first electrode connected to the first node, a second electrode connected to a data signal terminal, and a gate electrode connected to a second gate driving signal terminal; and a capacitor, connected between the first node and the third node.

In an embodiment of the present disclosure, the first gate driving circuit includes a plurality of first shift register units in cascade connection, and the first shift register unit includes: a first input circuit, connected to a first power supply terminal, a first clock signal terminal, a fourth node, a fifth node, a second clock signal terminal, and configured to transmit, in response to a signal from the first clock signal terminal, a signal from the first power supply terminal to the fourth node, and transmit, in response to a signal from the fourth node, a signal from the second clock signal terminal to the fifth node; a second input circuit, connected to the first power supply terminal, the first clock signal terminal, a first signal input terminal, a second power supply terminal and a sixth node, and configured to transmit, in response to the signal from the first clock signal terminal, the signal from the first power supply terminal to the sixth node, and transmit, in response to a signal from the first signal input terminal and the signal from the first clock signal terminal, a signal from the second power supply terminal to the sixth node; a first output circuit, connected to the sixth node, a seventh node, the first power supply terminal, a first signal output terminal and the second power supply terminal, and configured to transmit, in response to a signal from the sixth node, the signal from the second power supply terminal to the first signal output terminal, and transmit, in response to a signal from the seventh node, the signal from the first power supply terminal to the first signal output terminal, wherein the seventh node is connected to the fifth node; a first pull-down circuit, connected to the seventh node, the sixth node, the second power supply terminal and the fourth node, and configured to transmit, in response to the signal from the sixth node, the signal from the second power supply terminal to the seventh node and the fourth node; and a second pull-down circuit, connected to the fourth node, the sixth node, the second clock signal terminal and the second power supply terminal, and configured to transmit, in response to the signal from the fourth node and the signal from the second clock signal terminal, the signal from the second power supply terminal to the sixth node, wherein the first signal output terminal of the first shift register unit forms the first output terminal of the first gate driving circuit.

In an embodiment of the present disclosure, the first shift register unit further includes: an isolating circuit, connected to the fifth node, the seventh node and the second clock signal terminal, and configured to electrically connect, in response to the signal from the second clock signal terminal, the fifth node and the seventh node; a first reset circuit, connected to the sixth node, the first power supply terminal and a first reset signal terminal, and configured to transmit, in response to a signal from the first reset signal terminal, the signal from the first power supply terminal to the sixth node.

In an embodiment of the present disclosure, the first input circuit includes: a third transistor, having a first electrode connected to the first power supply terminal, a second electrode connected to the fourth node, and a gate electrode connected to the first clock signal terminal; a fourth transistor, having a first electrode connected to the second clock signal terminal, a second electrode connected to the fifth node, and a gate electrode connected to the fourth node; and a first capacitor, connected to the fourth node, the second input circuit includes: a fifth transistor, having a first electrode connected to the first power supply terminal and a gate electrode connected to the first clock signal terminal; a sixth transistor, having a first electrode connected to a second electrode of the fifth transistor, a second electrode connected to the sixth node, and a gate electrode connected to the first clock signal terminal; and a seventh transistor, having a first electrode connected to the second power supply terminal, a second electrode connected to the second electrode of the fifth transistor, and a gate electrode connected to the first signal input terminal.

In an embodiment of the present disclosure, the first output circuit includes: an eighth transistor, having a first electrode connected to the first power supply terminal, a second electrode connected to the first signal output terminal, and a gate electrode connected to the seventh node; a second capacitor, connected to the seventh node; a ninth transistor, having a first electrode connected to the second power supply terminal, a second electrode connected to the first signal output terminal, and a gate electrode connected to the sixth node; and a third capacitor, connected to the sixth node.

In an embodiment of the present disclosure, the first pull-down circuit includes: a tenth transistor, having a first electrode connected to the seventh node, a second electrode connected to the second power supply terminal, and a gate electrode connected to the sixth node; and an eleventh transistor, having a first electrode connected to the fourth node, a second electrode connected to the second power supply terminal, and a gate electrode connected to the sixth node, the second pull-down circuit includes: a twelfth transistor, having a first electrode connected to the second power supply terminal and a gate electrode connected to the fourth node; and a thirteenth transistor, having a first electrode connected to a second electrode of the twelfth transistor, a second electrode connected to the sixth node and a gate electrode connected to the second clock signal terminal.

In an embodiment of the present disclosure, the isolating circuit includes: a fourteenth transistor, having a first electrode connected to the fifth node, a second electrode connected to the seventh node, and a gate electrode connected to the second clock signal terminal, and the first reset circuit includes: a fifteenth transistor, having a first electrode connected to the first power supply terminal, a second electrode connected to the sixth node, and a gate electrode connected to the first reset signal terminal.

In an embodiment of the present disclosure, the pixel driving circuit further includes: a second transistor, having a first electrode connected to the first node, and a second electrode connected to a data signal terminal, the display panel further includes: a second gate driving circuit, including a plurality of second output terminals, the second output terminal being provided to correspond to the pixel driving circuit, and the second output terminal being connected to a gate electrode of the second transistor in the pixel driving circuit corresponding to the second output terminal, the second output terminal is configured to output the active level pulse during the data writing stage of the pixel driving circuit corresponding to the second output terminal.

In an embodiment of the present disclosure, a frame of the display panel includes a blank time period, and during the blank time period of the frame, at least a portion of the pixel driving circuit is in a sensing stage, and the sensing stage of the pixel driving circuit includes a sensing signal writing stage, a charging stage, a sampling stage, and a data signal writing back stage, the second output terminal corresponding to the pixel driving circuit which is in the sensing stage is further configured to respectively output the active level pulse during the sensing signal writing stage and the data signal writing back stage of the pixel driving circuit, and the first output terminal corresponding to the pixel driving circuit which is in the sensing stage is further configured to output the active level pulse in the sensing stage of the pixel driving circuit.

In an embodiment of the present disclosure, the second gate driving circuit includes a plurality of second shift register units in cascade connection, and the second shift register unit includes: a second output circuit, connected to an eighth node, a second signal output terminal and a third clock signal terminal, and configured to transmit, in response to a signal from the eighth node, a signal from the third clock signal terminal to the second signal output terminal, wherein the second signal output terminal of the second shift register unit is configured to form the second output terminal of the second gate driving circuit; and a first control circuit, connected to the eighth node, a fourth clock signal terminal, the second signal output terminal, a tenth node, an eleventh node, and a first control signal terminal, and configured to transmit, in response to a signal from the first control signal terminal, a signal from the second signal output terminal to the tenth node, transmit, in response to a signal from the tenth node, a signal from the fourth clock signal terminal to the eleventh node, and transmit, in response to the signal from the fourth clock signal terminal, a signal from the eleventh node to the eighth node, the first shift register unit further includes: a second control circuit, connected to the eleventh node, the fourth clock signal terminal and the fourth node in the second shift register unit corresponding to the second control circuit, and configured to transmit, in response to the signal from the fourth clock signal terminal, the signal from the eleventh node to the fourth node, wherein the second shift register unit and the first shift register unit corresponding to the same the pixel driving circuit correspond to each other, and the second shift register unit corresponds to the second control circuit in the first shift register unit corresponding to the second shift register unit.

In an embodiment of the present disclosure, the second shift register unit further includes: a third input circuit, connected to a third power supply terminal, the eighth node and a second signal input terminal, and configured to transmit, in response to a signal from the second signal input terminal, a signal from the third power supply terminal to the eighth node; a third pull-down circuit, connected to the third power supply terminal, the eighth node, a fourth power supply terminal, a ninth node and the second signal output terminal, and configured to transmit, in response to the signal from the third power supply terminal, the signal from the third power supply terminal to the ninth node, and transmit, in response to a signal from the ninth node, a signal from the fourth power supply terminal to the second signal output terminal and the eighth node; a fourth pull-down circuit, connected to the eighth node, the fourth power supply terminal, and the ninth node, and configured to transmit, in response to the signal from the eighth node, the signal from the fourth power supply terminal to the ninth node; a second reset circuit, connected to the eighth node, the fourth power supply terminal, and a second reset signal terminal, and configured to transmit, in response to information from the second reset signal terminal, the signal from the fourth power supply terminal to the eighth node; and a third reset circuit, connected to the eighth node, the fourth power supply terminal and a third reset signal terminal, and configured to transmit, in response to a signal from the third reset signal terminal, the signal from the fourth power supply terminal to the eighth node.

In an embodiment of the present disclosure, the third input circuit includes: a sixteenth transistor, having a first electrode connected to the third power supply terminal, a second electrode connected to the eighth node, and a gate electrode connected to the second signal input terminal, the third reset circuit includes: a seventeenth transistor, having a first electrode connected to the fourth power supply terminal, a second electrode connected to the eighth node, and a gate electrode connected to the third reset signal terminal, the second output circuit includes: an eighteenth transistor, having a first electrode connected to the third clock signal terminal, a second electrode connected to the second signal output terminal, and a gate electrode connected to the eighth node; and a fourth capacitor, connected to the eighth node, the third pull-down circuit includes: a nineteenth transistor, having a first electrode connected to the third power supply terminal, a second electrode connected to the ninth node, and a gate electrode connected to the third power supply terminal; a twentieth transistor, having a first electrode connected to the eighth node, a second electrode connected to the fourth power supply terminal, and a gate electrode connected to the ninth node; and a twenty-seventh transistor, having a first electrode connected to the fourth power supply terminal, a second electrode connected to the second signal output terminal, and a gate electrode connected to the ninth node, the fourth pull-down circuit includes: a twenty-first transistor, having a first electrode connected to the ninth node, a second electrode connected to the fourth power supply terminal, and a gate electrode connected to the eighth node, and the second reset circuit includes: a twenty-second transistor, having a first electrode connected to the fourth power supply terminal, a second electrode connected to the eighth node, and a gate electrode connected to the second reset signal terminal.

In an embodiment of the present disclosure, the first control circuit includes: a twenty-third transistor, having a first electrode connected to the second signal output terminal, a second electrode connected to the tenth node, and a gate electrode connected to the first control signal terminal; a twenty-fourth transistor, having a first electrode connected to the fourth clock signal terminal, a second electrode connected to the eleventh node, and a gate electrode connected to the tenth node; a twenty-fifth transistor, having a first electrode connected to the eleventh node, a second electrode connected to the eighth node, and a gate electrode connected to the fourth clock signal terminal; and a fifth capacitor, connected to the tenth node.

In an embodiment of the present disclosure, the second control circuit includes: a twenty-sixth transistor, having a first electrode connected to the eleventh node, a second electrode connected to the fourth node, and a gate electrode connected to the fourth clock signal terminal.

In an embodiment of the present disclosure, the first power supply terminal and the third power supply terminal share a same power supply terminal, and the second power supply terminal and the fourth power supply terminal share a same power supply terminal.

In an embodiment of the present disclosure, the display panel further includes: a first clock signal line, connected to the first clock signal terminal of the first shift register unit in an odd cascade and the second clock signal terminal of the first shift register unit in an even cascade; and a second clock signal line connected to the second clock signal terminal of the first shift register unit in the odd cascade and the first clock signal terminal of the first shift register unit in the even cascade.

In an embodiment of the present disclosure, the display panel further includes: a fourth clock signal line, connected to the fourth clock signal terminal in each of the first shift register units; and a reset signal line, connected to the first reset signal terminal in each of the first shift register units and the second reset signal terminal in each of the second shift register units.

An aspect of the present disclosure provides a driving method for driving the display panel described above, including: outputting the active level pulse through the first output terminal during the data writing stage, the black frame insertion stage, and the sensing stage of the pixel driving circuit corresponding to the first output terminal; and outputting the active level pulse through the second output terminal during the data writing stage, the sensing signal writing stage, and the data signal writing back stage of the pixel driving circuit corresponding to the second output terminal.

An aspect of the present disclosure provides a display device including the display panel described above.

It is to be understood that the above general description and the following detailed description are only exemplary and illustrate, and do not intend to limit the present disclosure.

BRIEF DESCRIPTION OF THE DRAWINGS

The accompanying drawings herein are incorporated into and form a part of the specification, illustrate embodiments consistent with the present disclosure, and are used in conjunction with the specification to explain the principle of the present disclosure. Obviously, the accompanying drawings in the following description are only some of the embodiments of the present disclosure, and those skilled in the art may obtain other accompanying drawings from these drawings without creative work.

DETAILED DESCRIPTION

Figure 1:
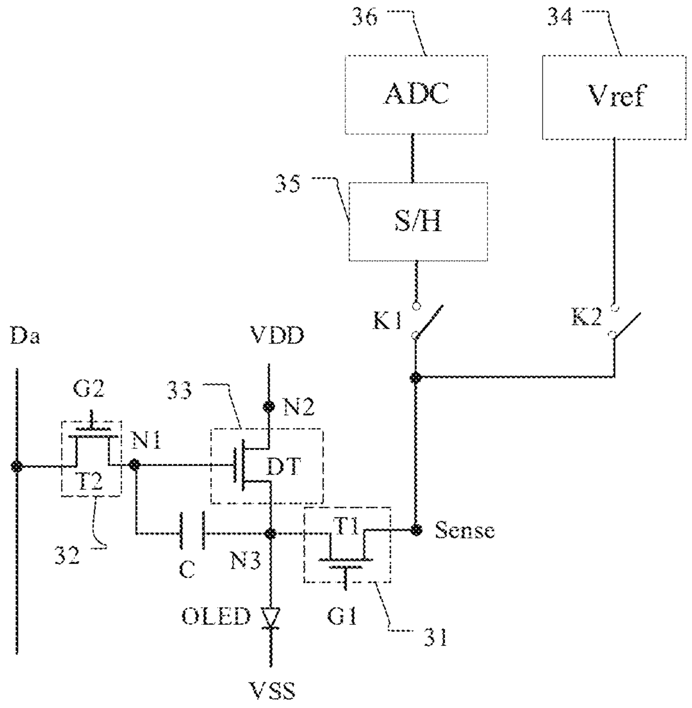
FIG. 1 is a schematic structure diagram of a pixel driving circuit in a display panel according to the present disclosure.

Example embodiments will now be described more fully with reference to the accompanying drawings. However, the example embodiments can be implemented in a variety of forms and should not be construed as being limited to the examples set forth herein; rather, these embodiments are provided so that the present disclosure is more comprehensive and complete and the concept of the example embodiments is conveyed comprehensively to those skilled in the art. The same reference numerals in the drawings indicate the same or similar structures, and thus detailed descriptions thereof will be omitted.

The terms "a", "an", "said" are used to indicate the presence of one or more elements/components/etc.; and the terms "comprising" and "having" are used to indicate an open-ended meaning and mean that there may be an additional element/component/etc. in addition to the listed element/component/etc.

As shown in FIG. 1, it is a schematic structure diagram of a pixel driving circuit in a display panel according to the present disclosure. The pixel driving circuit may include a driving circuit 33, a first switching unit 31, a second switching unit 32, and a capacitor C. The driving circuit 33 is connected to a first node N1, a second node N2, and a third node N3, and is configured to input a driving current to the third node N3 through the second node N2 in response to a signal from the first node N1. The first switching unit 31 has a first terminal connected to the third node N3, a second terminal connected to a sensing signal terminal Sense, and a control terminal connected to a first gate driving signal terminal G1, and is configured to electrically connect the third node N3 to the sensing signal terminal Sense in response to a signal at a control terminal of the first switching unit 31. The second switching unit 32 has a first terminal connected to the first node N1, a second terminal connected to a data signal terminal Da, and a control terminal connected to a second gate driving signal terminal G2, and is configured to connect the first node N1 and the data signal terminal Da in response to a signal from the control terminal of the second switching unit 32. The capacitor is connected between the first node N1 and the third node N3. The second node N2 may be connected to a fifth power supply terminal VDD, the third node N3 may be connected to a first electrode of a light-emitting unit OLED, a second electrode of the light-emitting unit may be connected to a sixth power supply terminal VSS, the fifth power supply terminal VDD may be a high level signal terminal, and the sixth power supply terminal VSS may be a low level signal terminal. In an embodiment, as shown in FIG. 1, the driving circuit 33 may include a driving transistor DT, and the driving transistor DT has a first electrode connected to the second node N2, a second electrode connected to the third node N3, and a gate electrode connected to the first node N1. The first switching unit 31 may include a first transistor T1, and the first transistor T1 has a first electrode connected to the third node N3, a second electrode connected to the sensing signal terminal Sense, and a gate electrode connected to the first gate driving signal terminal G1. The second switching unit 32 may include a second transistor T2, and the second transistor T2 has a first electrode connected to the first node N1, a second electrode connected to a data signal terminal Da, and a gate electrode connected to the second gate driving signal terminal G2. The first transistor T1, the second transistor T2, and the driving transistor DT all may be N-type transistors. In addition, the sensing signal terminal Sense may be connected to a reference voltage generating circuit 34 via a switch K2, and the sensing signal terminal Sense may also be connected to an analogue-to-digital converter 36 via a switch K1 and a sample-and-hold circuit 35.

Figure 2:
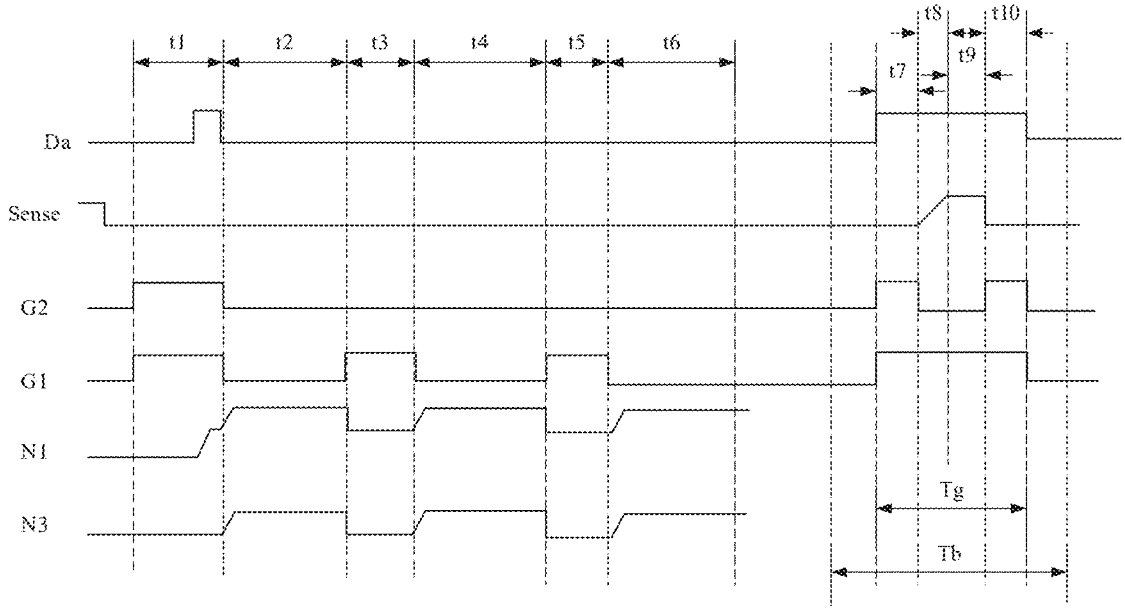
FIG. 2 is a timing diagram of each node in a method for driving the pixel driving circuit shown in FIG. 1.

As shown in FIG. 2, it is a timing diagram of each node in a method for driving the pixel driving circuit shown in FIG. 1, in which Da is a timing diagram of the data signal terminal, Sense is a timing diagram of the sensing signal terminal, G1 is a timing diagram of the first gate driving signal terminal, G2 is a timing diagram of the second gate driving signal terminal, N1 is a timing diagram of the first node, and N3 is a timing diagram of the third node. A driving cycle of the pixel driving circuit may include a data writing stage t1, a plurality of light-emitting stages t2, t4, t6, and black frame insertion stages t3, t5 provided between adjacent light-emitting stages. In the data writing stage t1, the first gate driving signal terminal G1 and the second gate driving signal terminal G2 output an active level, and the first transistor T1 and the second transistor T2 are turned on, and the data signal terminal Da writes a data signal to the first node N1 through the second transistor T2, and the sensing signal terminal Sense writes a reset signal to the third node N3. In the light-emitting stages t2, t4, t6, the first gate driving signal terminal G1 and the second gate driving signal terminal G2 output an inactive level, the first transistor T1 and the second transistor T2 are turned off, and the driving transistor DT provides a driving current to the light-emitting unit OLED under the action of the data signal stored in the first node N1. In the black frame insertion stages t3, t5, the first gate driving signal terminal G1 outputs an active level, the second gate driving signal terminal G2 outputs an inactive level, the first transistor T1 is turned on, the second transistor T2 is turned off, and the sensing signal terminal Sense writes a black screen signal to the third node N3.

It is to be noted that one driving period of the pixel driving circuit is from the starting moment of the data writing stage of a current frame to the starting moment of the data writing stage of a next frame. The active level is a potential that can drive a target circuit to operate normally, for example, when the first transistor T1 is an N-type transistor, the active level outputted from the first gate driving signal terminal G1 is a high level. Accordingly, the inactive level is logically opposite to the active level. In addition, the black screen signal and the reset signal output from the sensing signal terminal Sense may be provided by the reference voltage generating circuit 34, and the potentials of the black screen signal and the reset signal may be the same or different.

Figure 3:
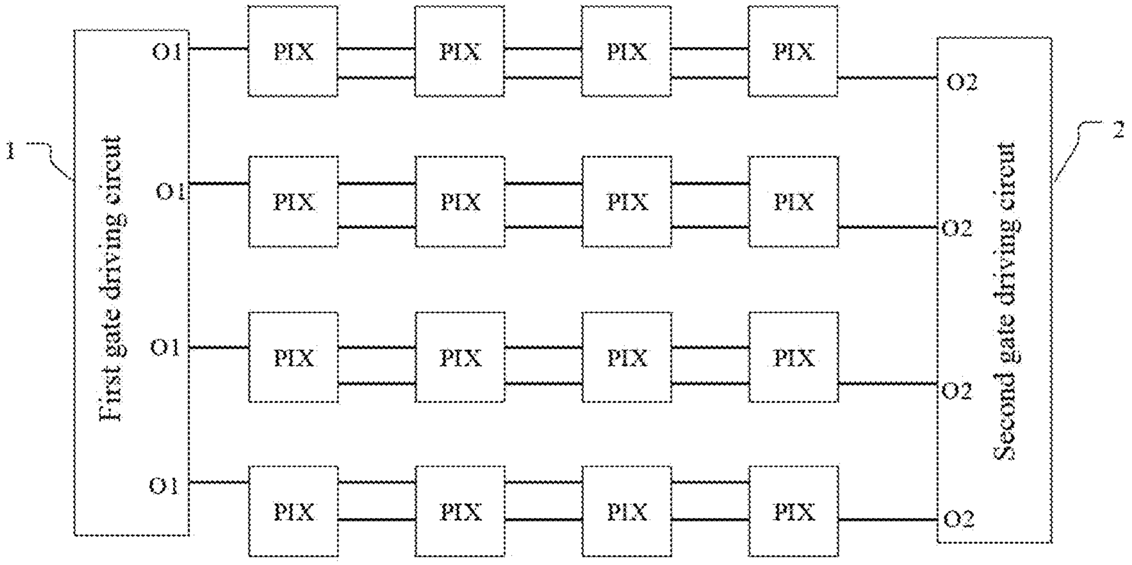
FIG. 3 is a schematic structure diagram of a display panel according to an embodiment of the present disclosure.

As shown in FIG. 3, it is a schematic structure diagram of a display panel according to an embodiment of the present disclosure. The display panel may include a plurality of pixel driving circuits PIX, and a first gate driving circuit 1. The structure of the pixel driving circuit PIX may be as shown in FIG. 1. The first gate driving circuit 1 may include a plurality of first output terminals O1, and the first output terminal O1 is provided to correspond to the pixel driving circuit, and as shown in FIG. 3, may be provided to correspond to a row of pixel driving circuits PIX. The first output terminal O1 is connected to the control terminal of the first switching unit 31 of the pixel driving circuit PIX corresponding thereto. It is to be understood that the first output terminal O1 may also be provided to correspond to a plurality of rows of pixel driving circuits, and furthermore, the first output terminal O1 may be provided to correspond to the pixel driving circuit in other ways. In other embodiments, the pixel driving circuit may also be of other structures.

In an embodiment of the present disclosure, on the one hand, the first output terminal O1 may be configured to input an active level pulse to the first gate driving signal terminal G1 of the pixel driving circuit during the data writing stage and the black frame insertion stage of the pixel driving circuit corresponding thereto, so as to enable the pixel driving circuit to realize the black frame insertion driving described above. The black frame insertion driving method can solve a technical problem of image drag during dynamic screen switching of the display panel. On the other hand, the structure of the pixel driving circuit in the display panel is simple, and the pixel driving circuit occupies less space, thereby facilitating the design of a high-resolution display panel.

Figure 4:
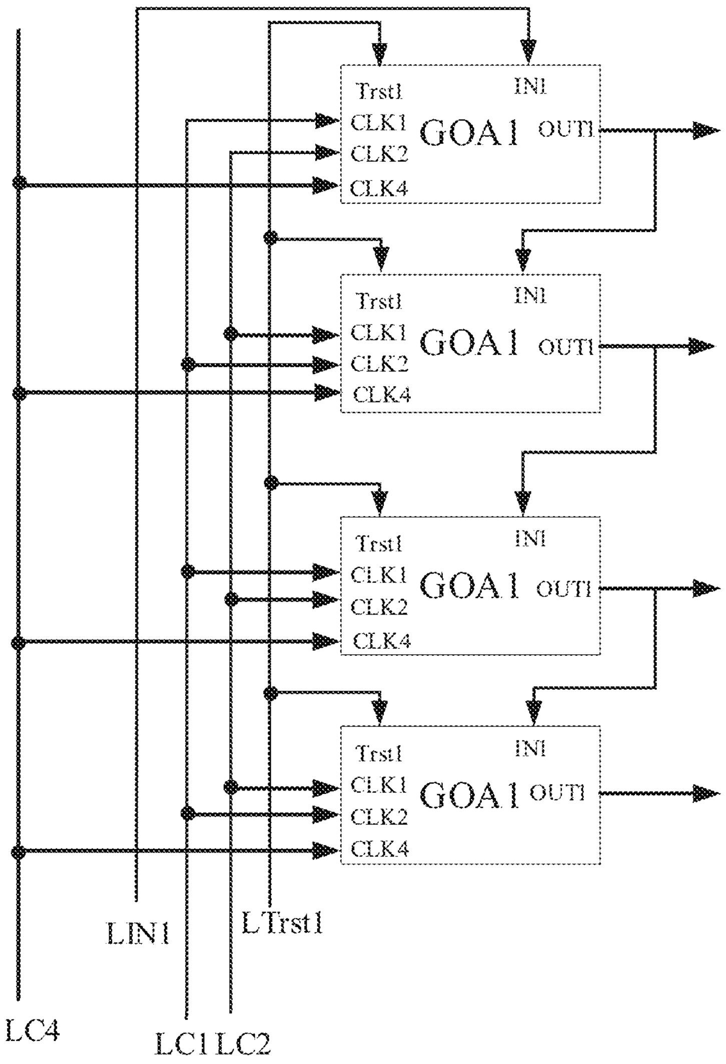
FIG. 4 is a schematic structure diagram of a first gate driving circuit of a display panel according to an embodiment of the present disclosure.
Figure 5:
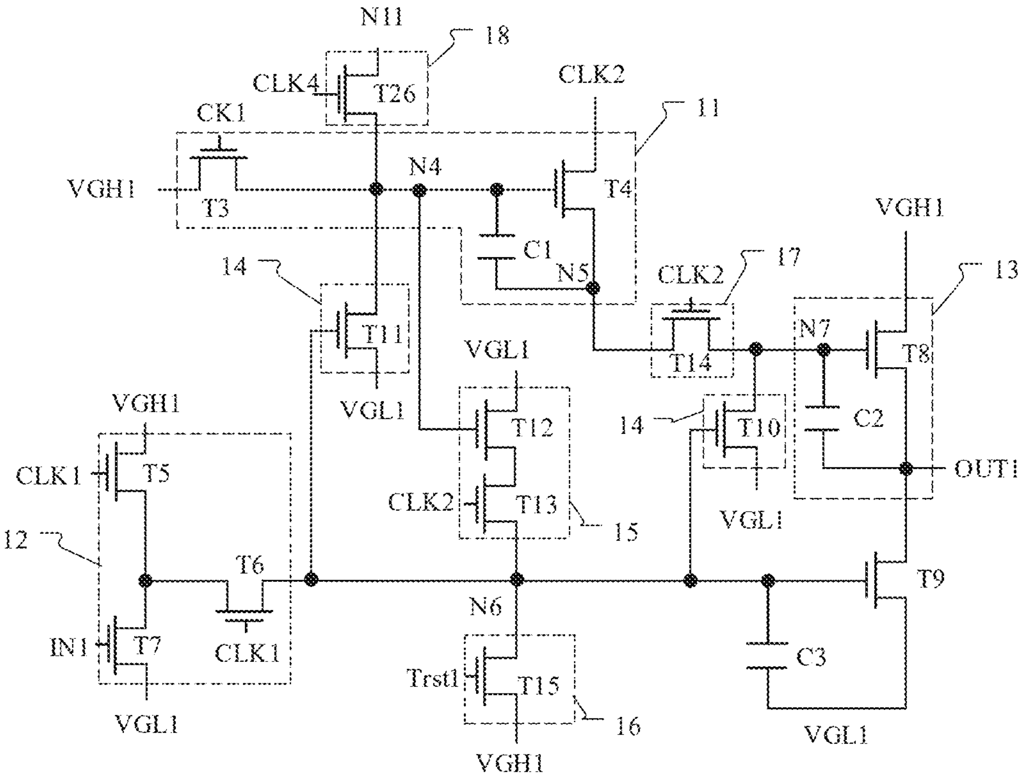
FIG. 5 is a schematic structure diagram of a first shift register unit of a display panel according to an embodiment of the present disclosure.

In an embodiment of the present disclosure, as shown in FIG. 4, it is a schematic structure diagram of a first gate driving circuit of a display panel according to an embodiment of the present disclosure. The first gate driving circuit 1 may include a plurality of first shift register units GOAL in cascade connection. As shown in FIG. 5, it is a schematic structure diagram of a first shift register unit of a display panel according to an embodiment of the present disclosure. The first shift register unit GOA1 may include a first input circuit 11, a second input circuit 12, a first output circuit 13, a first pull-down circuit 14, and a second pull-down circuit 15. The first input circuit 11 is connected to a first power supply terminal VGH1, a first clock signal terminal CLK1, a fourth node N4, a fifth node N5, and a second clock signal terminal CLK2, and is configured to transmit, in response to a signal from the first clock signal terminal CLK1, a signal from the first power supply terminal VGH1 to the fourth node N4, and transmit, in response to a signal from the fourth node N4, a signal from the second clock signal terminal CLK2 to the fifth node N5. The second input circuit 12 is connected to the first power supply terminal VGH1, the first clock signal terminal CLK1, a first signal input terminal IN1, a second power supply terminal VGL1 and a sixth node N6, and is configured to transmit, in response to a signal from the first clock signal terminal CLK1, a signal from the first power supply terminal VGH1 to the sixth node N6, and transmit, in response to a signal from the first signal input IN1 and the first clock signal terminal CLK1, a signal from the second power supply terminal VGL1 to the sixth node N6. The first output circuit 13 is connected to the sixth node N6, a seventh node N7, the first power supply terminal VGH1, a first signal output terminal OUT1, and the second power supply terminal VGL1, and is configured to transmit, in response to a signal from the sixth node N6, a signal from the second power supply terminal VGL1 to the first signal output terminal OUT1, and transmit, in response to a signal from the seventh node N7, a signal from the first power supply terminal VGH1 to the first signal output terminal OUT1. The seventh node N7 is connected to the fifth node N5. The first pull-down circuit 14 is connected to the seventh node N7, the sixth node N6, the second power supply terminal VGL1, and the fourth node N4, and is configure to transmit, in response to a signal from the sixth node N6, a signal from the second power supply terminal VGL1 to the seventh node N7 and fourth node N4. The second pull-down circuit 15 is connected to the fourth node N4, the sixth node N6, the second clock signal terminal CLK2, and the second power supply terminal VGL1, and is configured to transmit, in response to signals from the fourth node N4 and the second clock signal terminal CLK2, a signal from the second power supply terminal VGL1 to the sixth node N6. The first signal output terminal OUT1 of the first shift register unit GOA1 forms the first output terminal O1 of the first gate driving circuit 1.

In an embodiment, the first power supply terminal VGH1 is an active level signal terminal and the second power supply terminal VGL1 is an inactive level signal terminal. The driving method of the first shift register unit GOAL may include a first stage, a second stage, a third stage, and a fourth stage. In the first stage, the first signal input terminal IN1 and the first clock signal terminal CLK1 output an active level, and the second clock signal terminal CLK2 outputs an inactive level. The first input circuit 11 transmits the active level signal of the first power supply terminal VGH1 to the fourth node N4, and the seventh node N7 and the first signal output terminal OUT1 maintain the inactive level of the previous stage. In the second stage, the first signal input terminal IN1 and the second clock signal terminal CLK2 output the active level, and the first clock signal terminal CLK1 outputs the inactive level. The first input circuit 11 transmits the active level of the second clock signal terminal to the fifth node under the action of the fourth node N4, the active level of the fifth node N5 is transmitted to the seventh node, and the first output circuit transmits the active level signal of the first power supply terminal VGH1 to the first signal output terminal OUT1 under the action of the seventh node N7. Meanwhile, the second pull-down circuit 15 outputs an inactive level of the second power supply terminal VGL1 to the sixth node N6 under the action of the fourth node N4 and the second clock signal terminal CLK2. In the third stage, the first signal input terminal IN1 and the first clock signal terminal CLK1 output the inactive level, and the second clock signal terminal CLK2 outputs the active level. The fourth node N4 maintains the active level of the previous stage, the first input circuit 11 transmits the active level of the second clock signal terminal CLK2 to the fifth node under the action of the fourth node N4, the active level of the fifth node N5 is transmitted to the seventh node, and the first output circuit transmits the active level signal of the first power supply terminal VGH1 to the first signal output terminal OUT1 under the action of the seventh node N7. In the fourth stage, the first signal input terminal IN1 and the second clock signal terminal CLK2 output the inactive level, and the first clock signal terminal CLK1 outputs the active level. The second input circuit 12 transmits the active level signal of the first power supply terminal VGH1 to the sixth node N6 under the action of the first clock signal terminal CLK1, the first output circuit 13 transmits the inactive level of the second power supply terminal VGL1 to the first signal output terminal OUT1 under the action of the sixth node N6, and at the same time, the first pull-down circuit 14 transmits the inactive level of the second power supply terminal VGL1 to the fourth node N4 and the seventh node N7 under the action of the sixth node N6.

In an embodiment, as shown in FIG. 5, the first shift register unit GOAL may further include an isolating circuit 17, and the isolating circuit 17 is connected to the fifth node N5, the seventh node N7, and the second clock signal terminal CLK2, and is configured to electrically connect the fifth node N5 to the seventh node N7 in response to a signal from the second clock signal terminal CLK2. The isolating circuit 17 may lower the leakage current at the seventh node N7.

In an embodiment, as shown in FIG. 5, the first input circuit 11 may include a third transistor T3, a fourth transistor T4 and a first capacitor C1. The third transistor T3 has a first electrode connected to the first power supply terminal VGH1, a second electrode connected to the fourth node N4, and a gate electrode connected to the first clock signal terminal CLK1. The fourth transistor T4 has a first electrode connected to the second clock signal terminal CLK2, a second electrode connected to the fifth node N5 and a gate electrode connected to the fourth node N4. The first capacitor C1 is connected between the fourth node N4 and the fifth node N5. The second input circuit 12 may include a fifth transistor T5, a sixth transistor T6, a seventh transistor T7. The fifth transistor T5 has a first electrode connected to the first power supply terminal VGH1 and a gate electrode connected to the first clock signal terminal CLK1. The sixth transistor T6 has a first electrode connected to a second electrode of the fifth transistor T5, a second electrode connected to the sixth node N6, a gate electrode connected to the first clock signal terminal CLK1. The seventh transistor T7 has a first electrode connected to the second power supply terminal VGL1, a second electrode connected to the second electrode of the fifth transistor T5, and a gate electrode connected to the first signal input terminal IN1.

In an embodiment, as shown in FIG. 5, the first output circuit 13 may include an eighth transistor T8, a second capacitor C2, a ninth transistor T9, and a third capacitor C3. The eighth transistor T8 has a first electrode connected to the first power supply terminal VGH1, a second electrode connected to the first signal output terminal OUT1, and a gate electrode connected to the seventh node N7. The second capacitor C2 is connected between the seventh node N7 and the first signal output terminal OUT1. The ninth transistor T9 has a first electrode connected to the second power supply terminal VGL1, a second electrode connected to the first signal output terminal OUT1, and a gate electrode connected to the sixth node N6. The third capacitor C3 is connected between the sixth node N6 and the second power supply terminal VGL1.

In an embodiment, as shown in FIG. 5, the first pull-down circuit 14 may include a tenth transistor T10, and an eleventh transistor T11. The tenth transistor T10 has a first electrode connected to the seventh node N7, a second electrode connected to the second power supply terminal VGL1, and a gate electrode connected to the sixth node N6. The eleventh transistor T11 has a first electrode connected to the fourth node N4, a second electrode connected to the second power supply terminal VGL1, and a gate electrode connected to the sixth node N6. The second pull-down circuit 15 may include a twelfth transistor T12 and a thirteenth transistor T13. The twelfth transistor T12 has a first electrode connected to the second power supply terminal VGL1 and a gate electrode connected to the fourth node N4. The thirteenth transistor T13 has a first electrode connected to a second electrode of the twelfth transistor T12, a second electrode connected to the sixth node N6 and a gate electrode connected to the second clock signal terminal CLK2.

In an embodiment, as shown in FIG. 5, the isolating circuit 17 may include a fourteenth transistor T14 having a first electrode connected to the fifth node N5, a second electrode connected to the seventh node N7, and a gate electrode connected to the second clock signal terminal CLK2.

In an embodiment, the third transistor T3 to the fifteenth transistor T15 may be N-type transistors. The first power supply terminal VGH1 may be a high level signal terminal and the second power supply terminal VGL1 may be a low level signal terminal.

Figure 6:
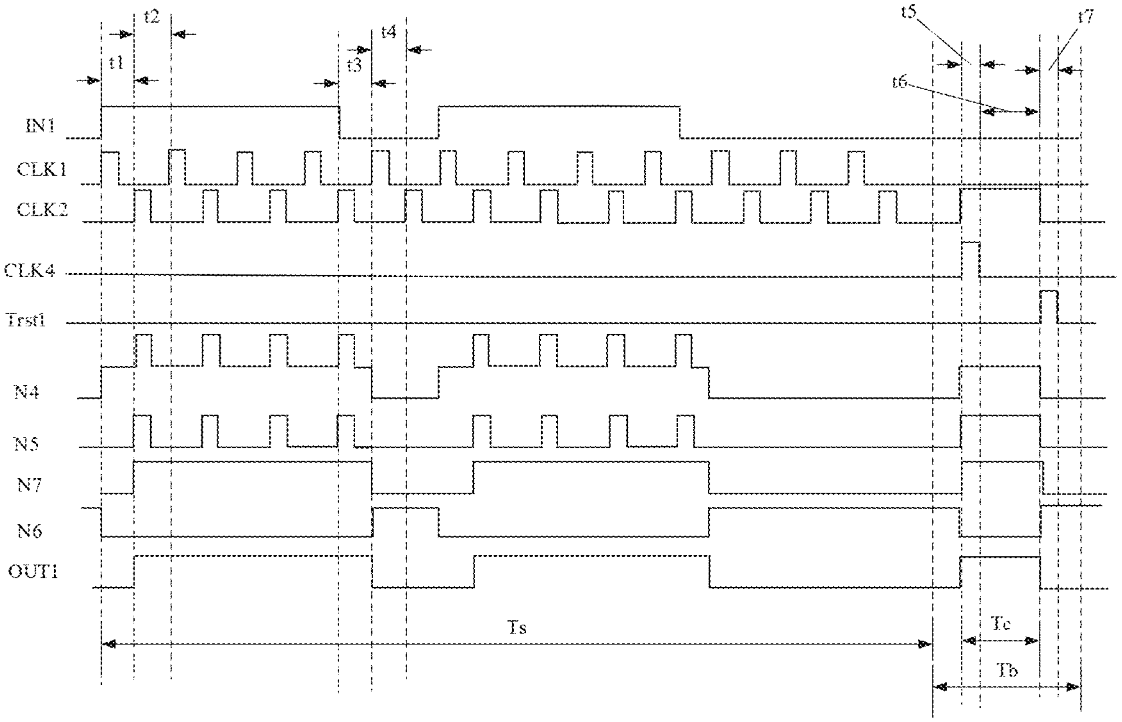
FIG. 6 is a timing diagram of each node in a method for driving the first shift register unit shown in FIG. 5.

As shown in FIG. 6, it is a timing diagram of each node in a method for driving the first shift register unit shown in FIG. 5. IN1 is a timing diagram of the first signal input terminal, CLK1 is a timing diagram of the first clock signal terminal, CLK2 is a timing diagram of the second clock signal terminal, Trst1 is a timing diagram of the first reset signal terminal, N4 is a timing diagram of the fourth node, N5 is a timing diagram of the fifth node, N6 is a timing diagram of the sixth node, N7 is a timing diagram of the seventh node, and OUT1 is a timing diagram of the first signal output terminal. A frame of the display panel may include a scanning time period Ts and a blank time period Tb. The driving method of the first shift register unit may include a first stage t1, a second stage t2, a third stage t3, and a fourth stage t4 in the scanning time period Ts.

In the first stage t1, the first signal input terminal IN1 and the first clock signal terminal CLK1 output a high level, and the second clock signal terminal CLK2 outputs a low level. The third transistor T3 is turned on to transmit a high level signal from the first power supply terminal VGH1 to the fourth node N4. The seventh node N7, and the first signal output terminal maintain the low level of the previous stage.

In the second stage t2, the first signal input terminal IN1 and the second clock signal terminal CLK2 output a high level, and the first clock signal terminal CLK1 outputs a low level. The fourth transistor T4 is turned on under the action of the fourth node N4 to transmit the high level signal of the second clock signal terminal CLK2 to the fifth node N5, the voltage of the fourth node N4 is further pulled up under the coupling action of the first capacitor C1, the fourteenth transistor T14 is turned on to transmit the high level signal of the fifth node N5 to the seventh node N7, and the eighth transistor T8 is turned on under the action of the seventh node N7 to transmit the high level signal of the first power supply terminal VGH1 to the first signal output terminal OUT1. At the same time, the twelfth transistor T12 and the thirteenth transistor T13 are turned on, and the low level signal of the second power supply terminal VGL1 is transmitted to the sixth node N6.

In the third stage t3, the first signal input terminal IN1 and the first clock signal terminal CLK1 output a low level, and the second clock signal terminal CLK2 outputs a high level. The fourth node N4 maintains the high level of the previous stage, the fourth transistor T4 is turned on under the action of the fourth node N4 to transmit the high level signal of the second clock signal terminal CLK2 to the fifth node N5, the voltage of the fourth node N4 is further pulled up under the coupling action of the first capacitor C1, the fourteenth transistor T14 is turned on to transmit the high level signal of the fifth node N5 to the seventh node N7, and the eighth transistor T8 is turned on under the action of the seventh node N7 to transmit the high level signal of the first power supply terminal VGH1 to the first signal output terminal OUT1. At the same time, the twelfth transistor T12 and the thirteenth transistor T13 are turned on, and the low level signal of the second power supply terminal VGL1 is transmitted to the sixth node N6.

In the fourth stage t4, the first signal input terminal IN1 and the second clock signal terminal CLK2 output a low level, and the first clock signal terminal CLK1 outputs a high level. The fifth transistor T5 and the sixth transistor T6 are turned on under the action of the first clock signal terminal CLK1, and the high level signal of the first power supply terminal VGH1 is transmitted to the sixth node N6, and the ninth transistor T9 is turned on under the action of the sixth node N6 to transmit the low level signal of the second power supply terminal VGL1 to the first signal output terminal OUT1. Meanwhile, the eleventh transistor T11 and the tenth transistor T10 are turned on under the action of the sixth node N6, and the low level signal of the second power supply terminal VGL1 is transmitted to the fourth node N4 and the seventh node N7.

The first shift register unit may shift and output the signal of the first signal input terminal IN1 via the first signal output terminal OUT1. As shown in FIG. 6, the first signal input terminal IN1 may output a plurality of high level pulses during a scanning time period Ts of the display panel, so that the first shift register unit may output a plurality of high level pulses during the scanning time period Ts of the display panel, and the plurality of high level pulses may be used to turn on the first transistor T1 in the data writing stage and the black frame insertion stage of the pixel driving circuit. It is to be noted that in an embodiment, the duration of the high level pulse output from the first signal input terminal IN1 may be adjusted according to actual demand. Within the time period of a single high level pulse output by the first signal input IN1, the first clock signal terminal CLK1 outputs at least one high level pulse signal, the second clock signal terminal CLK2 outputs at least one high level pulse signal, and when the first clock signal terminal CLK1 outputs a high level pulse signal, the second clock signal terminal CLK2 outputs a low level signal, and when the second clock signal terminal CLK2 outputs a high level pulse signal, the first clock signal terminal CLK1 outputs a low level signal. That is, as shown in FIG. 6, with the time period of a single high level pulse output from the first signal input terminal IN1, the driving method of the shift register unit includes at least the first stage t1 and the second stage t2.

As shown in FIGS. 1 and 2, the driving method of the pixel driving circuit may also include a sensing stage Tg in the blank time period Tb of the display panel, and the sensing stage Tg may include a sensing signal writing stage t7, a charging stage t8, a sampling stage t9, and a data signal writing back stage t10. In the sensing signal writing stage t7, the first gate driving signal terminal G1 and the second gate driving signal terminal G2 output a high level signal, the first transistor T1 and the second transistor T2 are turned on, the sensing signal terminal Sense inputs a reset signal to the third node N3, and the data signal terminal Da inputs a sense data signal to the first node N1. In the charging stage t8, the first gate driving signal terminal G1 outputs a high level signal, and the second gate driving signal terminal G2 outputs a low level signal, at which time the sensing signal terminal Sense is connected to the analogue-to-digital converter 36 through the sample-and-hold circuit 35. Meanwhile, in the charging stage t8, the driving transistor DT is turned on under the action of the first node N1 and inputs a current to the third node N3, and the voltages of the third node N3 and the sensing signal terminal Sense gradually increase, and when the gate-source voltage difference of the driving transistor DT is equal to a threshold voltage of the driving transistor, the driving transistor DT stops inputting the current to the third node N3, and the voltages of the third node N3 and the sensing signal terminal Sense no longer increase. In the sampling stage t9, the first gate driving signal terminal G1 outputs a high level signal and the second gate driving signal terminal G2 outputs a low level signal, and the driving chip of the display panel may sample the voltage of the sensing signal terminal Sense through the analogue-to-digital converter 36, and obtain the threshold value and the mobility of the driving transistor based on the sampled voltage. The display panel may compensate the data signal in the data writing stage of the pixel driving circuit based on the threshold value and mobility of the driving transistor to reduce uneven display due to differences in the threshold voltage of the driving transistor. In the data signal writing back stage t10, the first gate driving signal terminal G1 and the second gate driving signal terminal G2 output a high level signal, the first transistor T1 and the second transistor T2 are turned on, the data signal terminal Da rewrites the data signal written in the data writing stage t1 to the first node N1, and the sensing signal terminal Sense may likewise input a reset signal to the third node.

As shown in FIG. 3, the display panel may further include a second gate driving circuit 2, the second gate driving circuit 2 includes a plurality of second output terminals O2, and the second output terminal O2 is provided to correspond to the pixel driving circuit, for example, as shown in FIG. 3, the second output terminal O2 may be provided to correspond to a row of pixel driving circuits. The second output terminal O2 may be connected to the gate electrode of the second transistor T2 in the pixel driving circuit corresponding thereto. The second output terminal O2 may be configured to output an active level pulse during the data writing stage of the pixel driving circuit corresponding thereto. It is to be understood that the second output terminal O2 may also be provided to correspond to a plurality of pixel driving circuits, and furthermore, the second output terminal O2 may be provided to correspond to the pixel driving circuit in other ways.

In an embodiment of the present disclosure, in the blank time period Tb of a frame, at least some of the pixel driving circuits are in the sensing stage, and the display panel may sequentially sense the pixel driving circuits in the blank time periods of different frames, for example, it may sense the pixel driving circuits of a first row during the blank time period of a first frame, and sense the pixel driving circuits of a second row during the blank time period of a second frame. The second output terminal O2 corresponding to the pixel driving circuit in the sensing stage may also be configured to respectively output an active level pulse in the sensing signal writing stage and the data signal writing back stage of the pixel driving circuit, thereby realizing the sensing of the pixel driving circuit.

Figure 7:
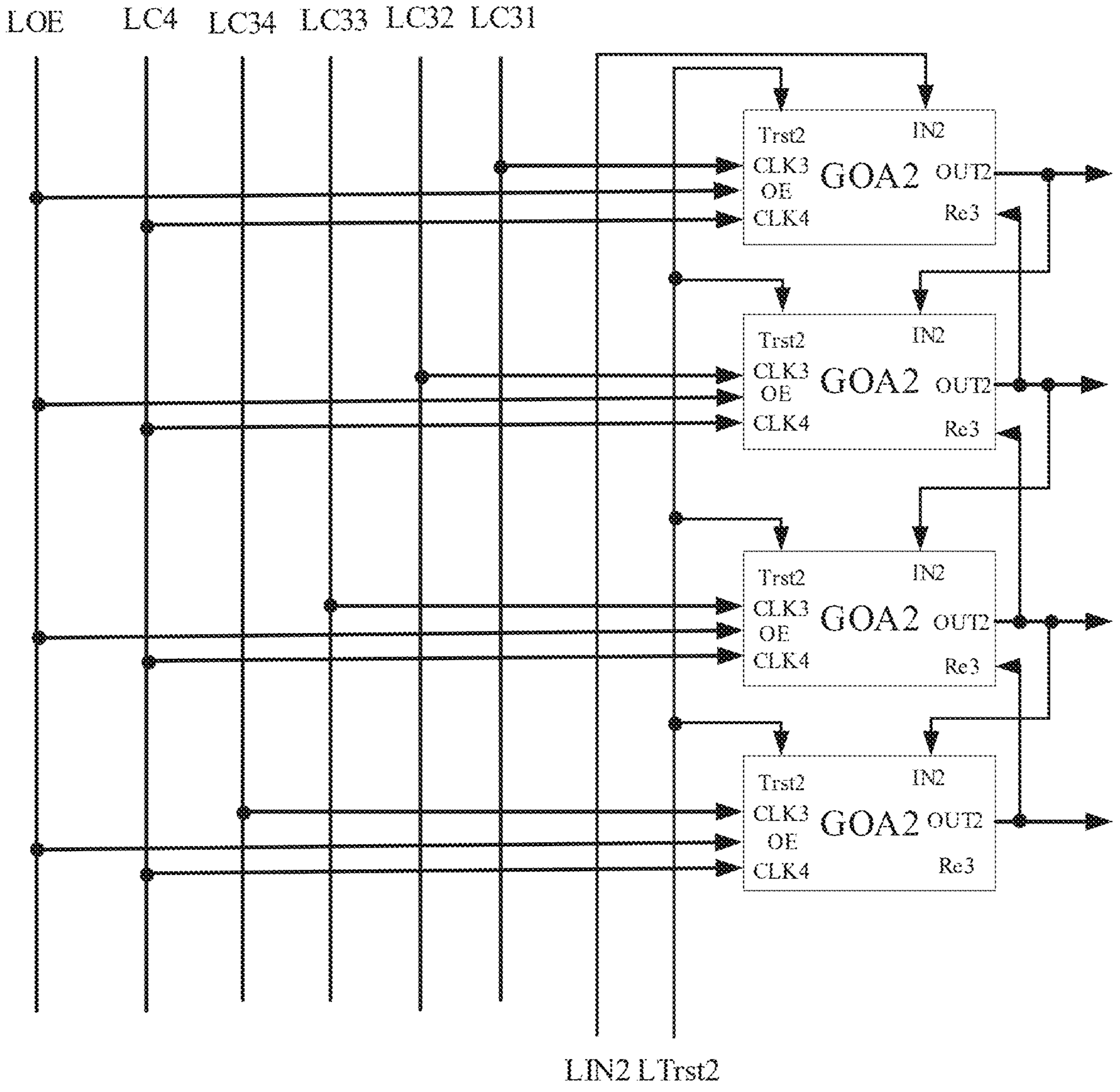
FIG. 7 is a schematic structure diagram of a second gate driving circuit of a display panel according to an embodiment of the present disclosure.

In an embodiment of the present disclosure, as shown in FIG. 7, it is s a schematic structure diagram of a second gate driving circuit of a display panel according to an embodiment of the present disclosure. The second gate driving circuit 2 may include a plurality of second shift register units GOA2 in cascade connection.

Figure 8:
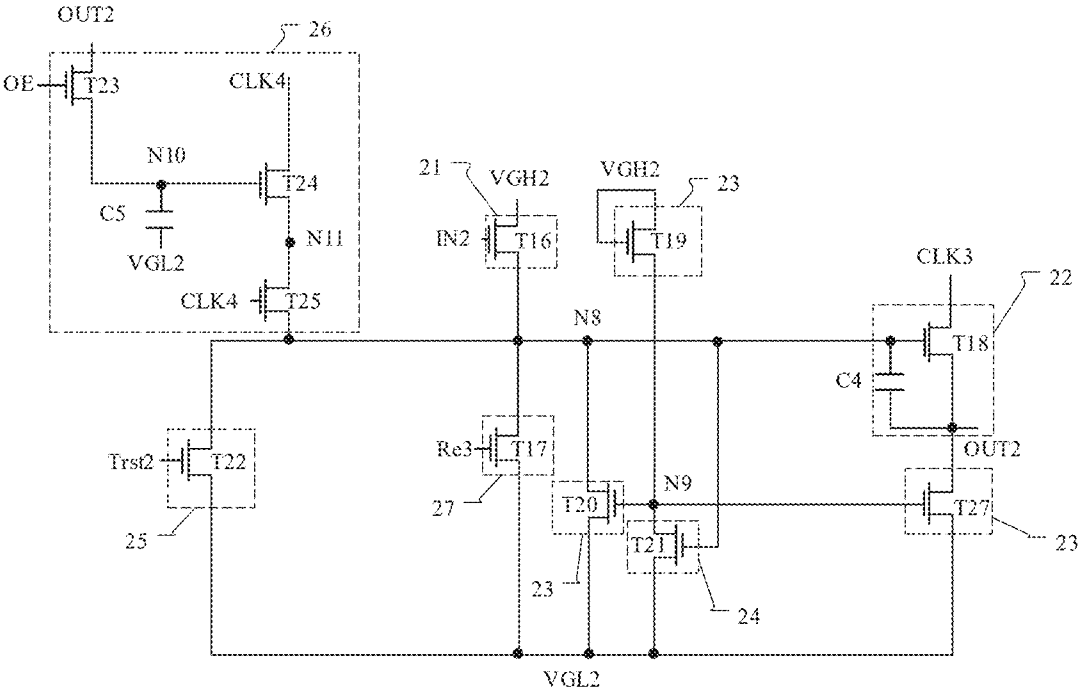
FIG. 8 is a schematic structure diagram of a second shift register unit according to an embodiment of the present disclosure.

In an embodiment, as shown in FIG. 8, it is a schematic structure diagram of a second shift register unit according to an embodiment of the present disclosure. The second shift register unit GOA2 may include a third input circuit 21, a third pull-down circuit 23, a fourth pull-down circuit 24, a second reset circuit 25, a second output circuit 22, a first control circuit 26, and a third reset circuit 27.

In an embodiment, as shown in FIG. 8, the third input circuit 21 is connected to a third power supply terminal VGH2, an eighth node N8, and a second signal input terminal IN2, and is configured to transmit a signal from the third power supply terminal VGH2 to the eighth node N8 in response to a signal from the second signal input terminal IN2. The second output circuit 22 is connected to the eighth node N8, a second signal output terminal OUT2, and a third clock signal terminal CLK3, and is configured to transmit a signal from the third clock signal terminal CLK3 to the second signal output terminal OUT2 in response to a signal from the eighth node N8. The second signal output terminal OUT2 of the second shift register unit GOA2 is configured to form the second output terminal O2 of the second gate driving circuit 2. The first control circuit 26 is connected to the eighth node N8, a fourth clock signal terminal CLK4, the second signal output terminal OUT2, a tenth node N10, an eleventh node N11 and a first control signal terminal OE, and is configured to transmit a signal from the second signal output terminal OUT2 to the tenth node N10 in response to a signal from the first control signal terminal OE, transmit a signal from the fourth clock signal terminal CLK4 to the eleventh node N11 in response to a signal from the tenth node N10, and transmit a signal from the eleventh node N11 to the eighth node N8 in response to a signal from the fourth clock signal terminal CLK4. The third reset circuit 27 is connected to the eighth node N8, a fourth power supply terminal VGL2, and a third reset signal terminal Re3, and is configured to transmit a signal from the fourth power supply terminal VGL2 to the eighth node N8 in response to a signal from the third reset signal terminal Re3.

In an embodiment, as shown in FIG. 8, the third pull-down circuit 23 is connected to the third power supply terminal VGH2, the eighth node N8, the fourth power supply terminal VGL2, a ninth node N9 and the second signal output terminal OUT2, and is configured to transmit a signal from the third power supply terminal VGH2 to the ninth node N9 in response to a signal from the third power supply terminal VGH2, and transmit a signal from the fourth power supply terminal VGL2 to the second signal output terminal OUT2 and the eighth node N8 in response to a signal from the ninth node N9. The fourth pull-down circuit 24 is connected to the eighth node N8, the fourth power supply terminal VGL2, and the ninth node N9, and is configured to transmit a signal from the fourth power supply terminal VGL2 to the ninth node N9 in response to a signal from the eighth node N8. The second reset circuit 25 is connected to the eighth node N8, the fourth power supply terminal VGL2, and a second reset signal terminal Tst2, and is configured to transmit a signal from the fourth power supply terminal VGL2 to the eighth node N8 in response to information from the second reset signal terminal Tst2.

In an embodiment, as shown in FIG. 7, the second signal output terminal OUT2 of the second shift register unit GOA2 in a current cascade is connected to the second signal input terminal IN2 of the second shift register unit GOA2 in a next cascade adjacent to the current cascade, and the second signal output terminal OUT2 of the second shift register unit GOA2 in the current cascade is connected to the third reset signal terminal Re3 of the second shift register unit GOA2 in a previous cascade adjacent to the current cascade.

In an embodiment, as shown in FIG. 8, the third input circuit 21 includes a sixteenth transistor T16 having a first electrode connected to the third power supply terminal VGH2, a second electrode connected to the eighth node N8, and a gate electrode connected to the second signal input terminal IN2. The third reset circuit 27 may include a seventeenth transistor T17 having a first electrode connected to the fourth power supply terminal VGL2, a second electrode connected to the eighth node N8, and a gate electrode connected to the third reset signal terminal Re3. The second output circuit 22 may include an eighteenth transistor T18, and a fourth capacitor C4, the eighteenth transistor T18 has a first electrode connected to the third clock signal terminal CLK3, a second electrode connected to the second signal output terminal OUT2, and a gate electrode connected to the eighth node N8, and the fourth capacitor C4 is connected between the eighth node N8 and the second signal output terminal OUT2. The third pull-down circuit 23 includes a nineteenth transistor T19, a twentieth transistor T20, and a twenty-seventh transistor T27, the nineteenth transistor T19 has a first electrode connected to the third power supply terminal VGH2, a second electrode connected to the ninth node N9, and a gate electrode connected to the third power supply terminal VGH2, the twentieth transistor T20 has a first electrode connected to the eighth node N8, a second electrode connected to the fourth power supply terminal VGL2 and a gate electrode connected to the ninth node N9, the twenty-seventh transistor T27 has a first electrode connected to the fourth power supply terminal VGL2, a second electrode connected to the second signal output terminal OUT2, and a gate electrode connected to the ninth node N9. The fourth pull-down circuit 24 includes a twenty-first transistor T21 having a first electrode connected to the ninth node N9, a second electrode connected to the fourth power supply terminal VGL2, and a gate electrode connected to the eighth node N8. The second reset circuit 25 includes a twenty-second transistor T22 having a first electrode connected to the fourth power supply terminal VGL2, a second electrode connected to the eighth node N8, and a gate electrode connected to the second reset signal terminal Trst2.

In an embodiment, as shown in FIG. 8, the first control circuit 26 includes a twenty-third transistor T23, a twenty-fourth transistor T24, a twenty-fifth transistor T25, and a fifth capacitor C5, the twenty-third transistor T23 has a first electrode connected to the second signal output terminal OUT2, a second electrode connected to the tenth node N10, and a gate electrode connected to the first control signal terminal OE, the twenty-fourth transistor T24 has a first electrode connected to the fourth clock signal terminal CLK4, a second electrode connected to the eleventh node N11, and a gate electrode connected to the tenth node N10, the twenty-fifth transistor T25 has a first electrode connected to the eleventh node N11, a second electrode connected to the eighth node N8, and a gate electrode connected to the fourth clock signal terminal CLK4, and the fifth capacitor C5 is connected between the tenth node N10 and the fourth power supply terminal VGL2.

In an embodiment, the sixteenth transistor T16 to the twenty-fifth transistor T25, and the twenty-seventh transistor T27 may be N-type transistors, the third power supply terminal VGH2 may be a high level signal terminal, and the fourth power supply terminal VGL2 may be a low level signal terminal.

Figure 9:
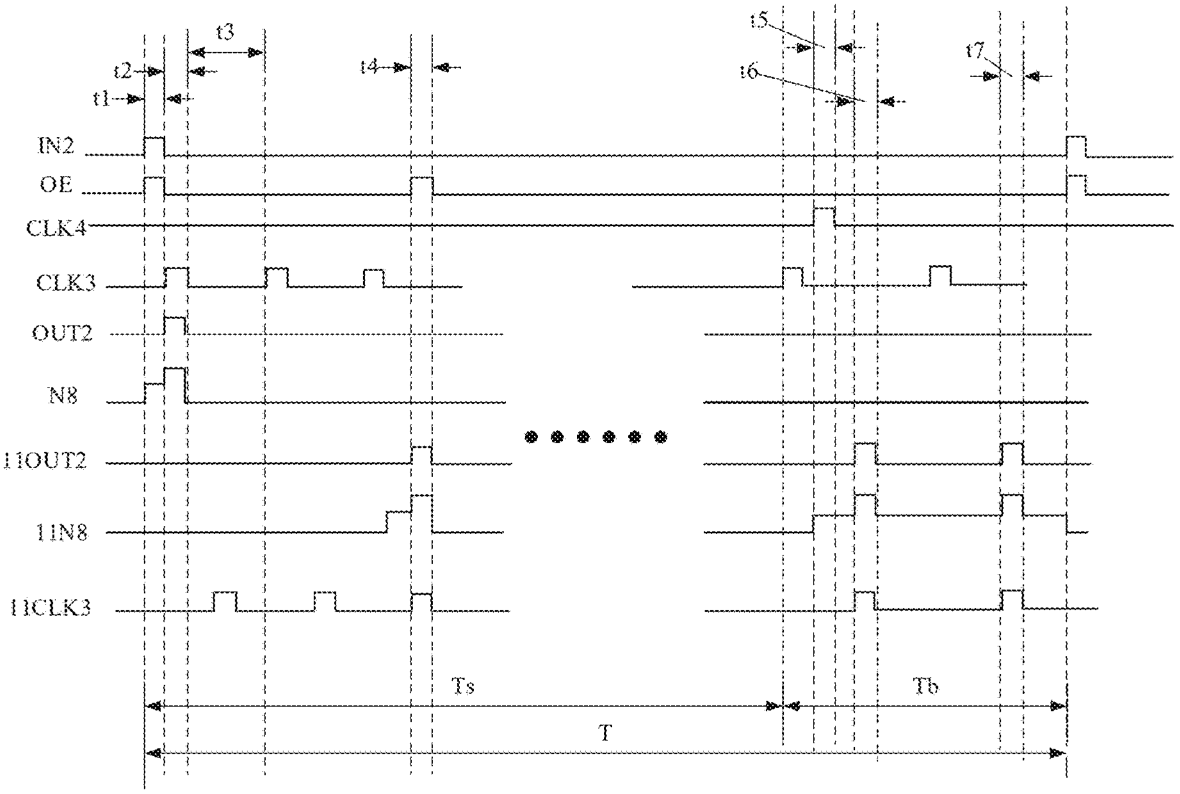
FIG. 9 is a timing diagram of each node in a method for driving the second shift register unit shown in FIG. 8.

As shown in FIG. 9, it is a timing diagram of each node in a method for driving the second shift register unit shown in FIG. 8, in which IN2 is a timing diagram of the second signal input terminal in the second shift register unit of a first cascade, OE is a timing diagram of the first control signal terminal OE in the second shift register unit of any cascade, CLK3 is a timing diagram of the third clock signal terminal in the second shift register unit of the first cascade, CLK4 is a timing diagram of the fourth clock signal terminal in the second shift register unit of any cascade, OUT2 is a timing diagram of the second signal output terminal in the second shift register unit of the first cascade, N8 is a timing diagram of the eighth node in the second shift register unit of the first cascade, 11OUT2 is a timing diagram of the second signal output terminal in the second shift register unit of an eleventh cascade, 11N8 is a timing diagram of the eighth node in the second shift register unit of the eleventh cascade, and 11CLK3 is a timing diagram of the third clock signal terminal in the second shift register unit of the eleventh cascade.

As shown in FIG. 9, a frame T of the display panel includes a scanning time period Ts and a blank time period Tb. In the scanning time period Ts, the second gate driving circuit may input a gate driving signal to the second gate driving signal terminals of the pixel driving circuits row by row. In the blank time period Tb, the second gate driving circuit may also input two high level pulse signals to the pixel driving circuit in the detecting stage.

As shown in FIG. 9, for the second shift register unit of the first cascade:

In the first stage t1, the second signal input terminal IN2 and the first control signal terminal OE of the second shift register unit of the first cascade output a high level signal, and the third clock signal terminal CLK3 and the fourth clock signal terminal CLK4 thereof output a low level signal. The sixteenth transistor T16 is turned on under the action of the second signal input terminal IN2, and a high level signal of the third power supply terminal VGH2 is transmitted to the eighth node N8 through the sixteenth transistor T16, and the eighteenth transistor T18 is turned on under the action of the eighth node N8 to transmit a low level signal of the third clock signal terminal CLK3 to the second signal output terminal OUT2. At the same time, the twenty-first transistor T21 is turned on and a low level signal of the fourth power supply terminal VGL2 is transmitted to the ninth node N9 to turn off the twentieth transistor T20 and the twenty-seventh transistor T27.

In the second stage t2, the second signal input terminal IN2, the first control signal terminal OE, and the fourth clock signal terminal CLK4 of the second shift register unit of the first cascade output a low level signal, and the third clock signal terminal CLK3 thereof outputs a high level signal. The eighteenth transistor T18 transmits the high level signal of the third clock signal terminal CLK3 to the second signal output terminal OUT2 under the action of the eighth node N8. At the same time, the voltage of the eighth node N8 is pulled up under the coupling action of the fourth capacitor C4. In addition, the twenty-first transistor T21 is turned on and the low level signal of the fourth power supply terminal VGL2 is transmitted to the ninth node N9 to turn off the twentieth transistor T20 and the twenty-seventh transistor T27.

In the third stage t3, the second signal input terminal IN2, the first control signal terminal OE, the fourth clock signal terminal CLK4, and the third clock signal terminal CLK3 of the second shift register unit of the first cascade output a low level signal, and the reset signal terminal Re3 thereof outputs a high level signal under the action of the second signal output terminal OUT2 of the second shift register unit GOA2 of the second cascade. The seventeenth transistor T17 is turned on, the fourth power supply terminal VGL2 inputs a low level signal to the eighth node N8, the nineteenth transistor T19 is turned on under the action of the third power supply terminal VGH2 to transmit the high level signal from the third power supply terminal VGH2 to the ninth node N9, and the twenty-seventh transistor T27 is turned on under the action of the ninth node N9 to transmit the low level signal from the fourth power supply terminal VGL2 to the second signal output terminal OUT2. Meanwhile, the twentieth transistor T20 is turned on under the action of the ninth node N9 to transmit the low level signal of the fourth power supply terminal VGL2 to the eighth node N8.

For the second shift register unit of the eleventh cascade:

In the fourth stage t4, the second signal output terminal of the second shift register unit GOA2 of the eleventh cascade outputs a high level signal, and at the same time, the first control signal terminal OE thereof outputs a high level signal, and the high level signal output from the second signal output terminal of the second shift register unit GOA2 of the eleventh cascade is transmitted to the tenth node N10 thereof through the twentieth thirteenth transistor T23 thereof. That is, the first control signal terminal OE may select to write the high level signal to the tenth node in the second shift register unit of any cascade by controlling the time period in which the high level pulse signal is output.

In the fifth stage t5 in the blank time period Tb, the fourth clock signal terminal CLK4 outputs a high level signal, and the twenty-fourth transistor T24 and the twenty-fifth transistor T25 are turned on to transmit the high level signal of the fourth clock signal terminal CLK4 to the eleventh node N11 and the eighth node N8.

In the sixth stage t6 in the blank time period, the third clock signal terminal of the second shift register unit of the eleventh cascade outputs a high level signal, and the eighteenth transistor T18 is turned on to transmit the high level signal of the third clock signal terminal to the second signal output terminal of the second shift register unit of the eleventh cascade.

In the seventh stage t7 in the blank time period, the third clock signal terminal of the second shift register unit of the eleventh cascade outputs a high level signal, and the eighteenth transistor T18 is turned on to transmit the high level signal of the third clock signal terminal to the second signal output terminal of the second shift register unit of the eleventh cascade.

Then in the first stage of a next frame, the first control signal terminal OE outputs a high level signal, and the twenty-third transistor T23 is turned on to transmit a low level signal of the second signal output terminal OUT2 in the second shift register unit of the eleventh cascade to the tenth node N10.

In an embodiment, the second gate driving circuit 2 may select a pixel driving circuit row to be sensed in a current frame via the first control signal terminal OE. In this regard, the sixth stage in FIG. 9 corresponds to the sensing signal writing stage in FIG. 2, and the seventh stage output in FIG. 9 corresponds to the data signal writing back stage in FIG. 2. That is, the high level pulse output by the second shift register unit in the sixth stage is used to turn on the second transistor in the sensing signal writing stage of the pixel driving circuit, and the high level pulse output by the second shift register unit in the seventh stage is used to turn on the second transistor in the data signal writing back stage of the pixel driving circuit.

As shown in FIG. 7, the second gate driving circuit may adopt a 4CLK architecture, i.e., the second gate driving circuit may include four clock signal lines LC31, LC32, LC33, and LC34, and the four clock signal lines LC31, LC32, LC33, and LC34 are used to provide clock signals to the third clock signal terminals CLK3 in the second shift register units. As shown in FIG. 7, the third clock signal terminal of the second shift register unit of the $(1+4n)^{th}$ cascade is connected to the clock signal line LC31, the third clock signal terminal of the second shift register unit of the $(2+4n)^{th}$ cascade is connected to the clock signal line LC32, the third clock signal terminal of the second shift register unit of the $(3+4n)^{th}$ cascade is connected to the clock signal line LC33, and the third clock signal terminal of the second shift register unit of the $(4+4n)^{th}$ cascade is connected to the clock signal line LC34, wherein n is an integer greater than or equal to 0. As shown in FIG. 7, the second gate driving circuit may further include a second signal input line LIN2, a second reset signal line LTrst2, a first control signal line LOE, and a fourth clock signal line LC4.

The second signal input line LIN2 is connected to the second signal input terminal IN2 of the second shift register unit of the first cascade, the second reset signal line LTrst2 is connected to the second reset signal terminal Trst2 of the second shift register unit of each cascade, the first control signal line LOE is connected to the first control signal terminal OE of the second shift register unit of each cascade, and the fourth clock signal line LC4 is connected to the fourth clock signal terminal CLK4 of the second shift register unit of each cascade. It should be appreciated that in other embodiments, the second gate driving circuit may adopt other CLK architectures, for example, a 3CLK architecture, a 5CLK architecture, and the like.

Figure 10:
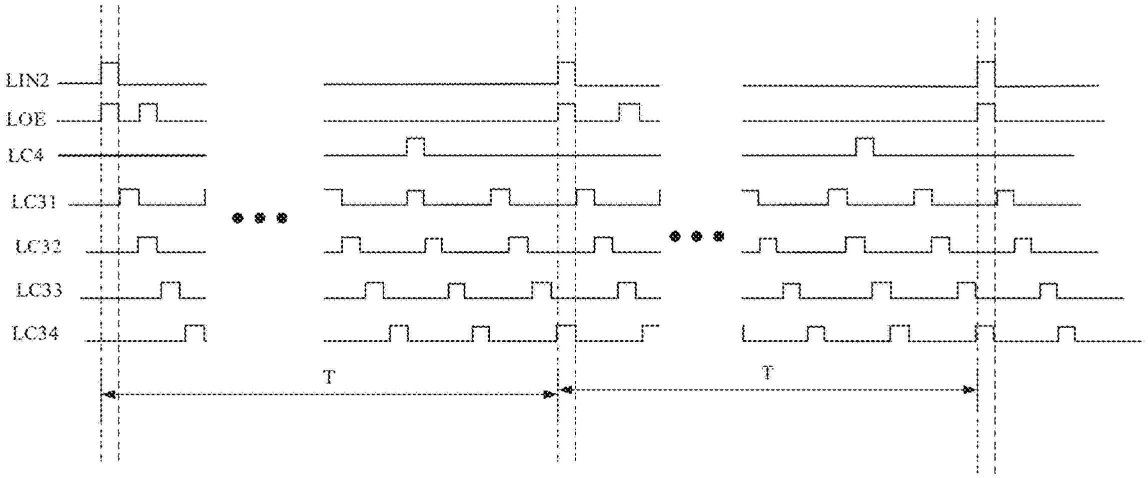
FIG. 10 is a timing diagram of each signal line in the second gate driving circuit shown in FIG. 7.

As shown in FIG. 10, it is a timing diagram of each signal line in the second gate driving circuit shown in FIG. 7, in which LC31 is a timing diagram of the clock signal line LC31, LC32 is a timing diagram of the clock signal line LC32, LC33 is a timing diagram of the clock signal line LC33, LC34 is a timing diagram of the clock signal line LC34, LIN2 is a timing diagram of the second signal input line LIN2, LTrst2 is a timing diagram of the second reset signal line LTrst2, LOE is a timing diagram of the first control signal line LOE, and LC4 is a timing diagram of the fourth clock signal line LC4. As shown in FIG. 10, the second signal input line LIN2 inputs a high level signal to the second shift register unit of the first cascade in the start time period of each frame T. The first control signal line LOE, in addition to providing a high level signal in the start time period of each frame along with the second signal input line LIN2, outputs a high level signal in any scanning time period of this frame to selectively transmit the high level at the output terminal of any second shift register unit to the tenth node N10 of this second shift register unit. The fourth clock signal line LC4 outputs a high level pulse in a blank time period of a frame to write a high level signal to the eighth node N8 in the second shift register unit selected by the first control signal line LOE. In addition, the second reset signal line LTret2 may output a high level pulse in an end stage of a frame to reset the eighth node N8.

In an embodiment, as shown in FIG. 2, the first output terminal O1 corresponding to the pixel driving circuit in the sensing stage Tg is also used to output an active level pulse in the sensing stage Tg of the pixel driving circuit. The active level is a high level.

Correspondingly, as shown in FIG. 5, the first shift register unit GOAL may further include a first reset circuit 16 and a second control circuit 18. The first reset circuit 16 is connected to the sixth node N6, the first power supply terminal VGH1 and the first reset signal terminal Trst1, and is configured to transmit a signal from the first power supply terminal VGH1 to the sixth node N6 in response to a signal from the first reset signal terminal Trst1. The second control circuit 18 is connected to the eleventh node N11, the fourth clock signal terminal CLK4 and the fourth node N4 in the second shift register unit GOA2 corresponding thereto, and is configured to transmit, in response to a signal from the fourth clock signal terminal CLK4, a signal from the eleventh node N11 to the fourth node N4. The second shift register unit GOA2 and the first shift register unit GOA1 corresponding to the same the pixel driving circuit corresponds to each other, and the second shift register unit GOA2 corresponds to the second control circuit 18 in the first shift register unit GOAL corresponding thereto.

In an embodiment, the first reset circuit 16 may include a fifteenth transistor T15 having a first electrode connected to the first power supply terminal VGH1, a second electrode connected to the sixth node N6, and a gate electrode connected to the first reset signal terminal Trst1. The second control circuit 18 may include a twenty-sixth transistor T26 having a first electrode connected to the eleventh node N11, a second electrode connected to the fourth node N4, and a gate electrode connected to the fourth clock signal terminal CLK4. The fifteenth transistor T15 and the twenty-sixth transistor T26 may be N-type transistors.

As shown in FIG. 6, when the pixel driving circuit corresponding to the first shift register unit is sensed in a current frame, the eleventh node N11 has a high potential in the blank time period. The method for driving the first shift register unit may also include a sense driving stage Tc in the blank time period Tb, and the sense driving stage Tc may include a fifth stage t5 and a sixth stage t6. In the fifth stage t5, the second clock signal terminal CLK2 and the fourth clock signal terminal CLK4 output a high level signal, the twenty-sixth transistor T26 is turned on under the action of the fourth clock signal terminal CLK4, the high level signal of the eleventh node N11 is transmitted to the fourth node, the fourth transistor T4 is turned on under the action of the fourth node N4, the fourteenth transistor T14 is turned on under the action of the second clock signal terminal CLK2, the high level signal of the second clock signal terminal CLK2 is transmitted to the seventh node N7, and the eighth transistor T8 is turned on under the action of the seventh node N7 to transmit the high level signal of the first power supply terminal to the first signal output terminal OUT1. In the sixth stage t6, the second clock signal terminal CLK2 outputs a high level signal, the fourth clock signal terminal CLK4 outputs a low level signal, the seventh node N7 maintains the high level signal in the fifth stage t5, and the eighth transistor T8 is turned on under the action of the seventh node N7 to transmit the high level signal of the first power supply terminal VGH1 to the first signal output terminal OUT1.

As shown in FIG. 6, the method for driving the first shift register unit may further include a seventh stage t7 in the blank time period Tb. In the seventh stage t7, the first reset signal terminal Trst1 outputs a high level signal, the fifteenth transistor T15 is turned on, the first power supply terminal VGH1 inputs a high level signal to the sixth node N6, the eleventh transistor T11, the tenth transistor T10 and the ninth transistor T9 are turned on, and the second power supply terminal VGL1 inputs a low level signal to the fourth node N4, the seventh node N7, and the first signal output terminal OUT1.

The sense driving stage Tc in FIG. 6 corresponds to the sensing stage Tg in FIG. 2, i.e., the high level signal output by the first shift register unit in the sense driving stage Tc can be used to drive the pixel driving circuit which is in the sense driving stage Tc.

As shown in FIG. 4, in the first gate driving circuit, the first signal output terminal OUT1 of the first shift register unit GOA1 in the first cascade is connected to the first signal input terminal IN1 of the first shift register unit GOAL in an adjacent next cascade. The display panel may further include a first clock signal line LC1, a second clock signal line LC2, a first signal input line LIN1, a first reset signal line LTrst1, and a fourth clock signal line LC4. The first clock signal line LC1 is connected to the first clock signal terminal CLK1 of the first shift register unit GOA1 in an odd cascade and the second clock signal terminal CLK2 of the first shift register unit GOA1 in an even cascade. The second clock signal line LC2 is connected to the second clock signal terminal CLK2 of the first shift register unit GOAL in the odd cascade and the first clock signal terminal CLK1 of the first shift register unit GOAL in the even cascade. The first signal input line LIN1 is connected to the first signal input terminal IN1 of the first shift register unit GOA1 in the first cascade. The first reset signal line LTrst1 is connected to the first reset signal terminal Trst1 of the first shift register unit GOAL in each cascade. The fourth clock signal line LC4 is connected to the fourth clock signal terminal of the first shift register unit GOAL in each cascade.

Figure 11:
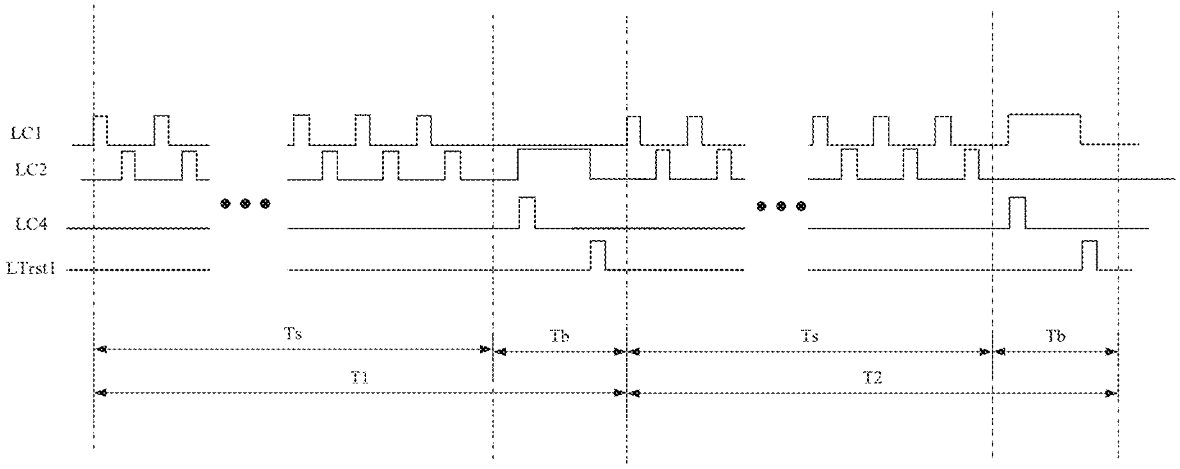
FIG. 11 is a timing diagram of each signal line in a method for driving the first gate driving circuit shown in FIG. 4.

As shown in FIG. 11, it is a timing diagram of each signal line in a method for driving the first gate driving circuit shown in FIG. 4, in which LC1 is a timing diagram of the first clock signal line, LC2 is a timing diagram of the second clock signal line, LC4 is a timing diagram of the fourth clock signal line, and LTrst1 is a timing diagram of the first reset signal line.

As shown in FIG. 11, the first clock signal line LC1 and the second clock signal line LC2 alternately output a high level pulse signal in blank time periods Tb of adjacent frames. For example, in the blank time period Tb in a frame T1, the second clock signal line LC2 outputs a high-level pulse signal to enable the second clock signal terminal CLK2 of the first shift register unit in the odd cascade to output a high-level signal; and in the blank time period Tb in a frame T2, the first clock signal line LC1 outputs a high level pulse signal to enable the second clock signal terminal CLK2 of the first shift register unit in the even cascade to output a high level signal. The first reset signal line LTrst1 may input a reset signal to the first shift register unit GOA1 in the blank time period of each frame.

In an embodiment, the first power supply terminal VGH1 and the third power supply terminal VGH2 may share the same power supply terminal, and the second power supply terminal VGL1 and the fourth power supply terminal VGL2 may share the same power supply terminal.

In an embodiment, the fourth clock signal line in the first gate driving circuit and the fourth clock signal line in the second gate driving circuit may share the same signal line, and the first reset signal line in the first gate driving circuit and the second reset signal line in the second gate driving circuit may share the same signal line.

An embodiment of the present disclosure also provides a method for driving the display panel described above, and the method includes:

- outputting the active level pulse through the first output terminal O1 during the data writing stage, the black frame insertion stage, and the sensing stage of the pixel driving circuit corresponding to the first output terminal; and
- outputting the active level pulse through the second output terminal O2 during the data writing stage, the sensing signal writing stage, and the data signal writing back stage of the pixel driving circuit corresponding to the second output terminal.

The driving method has been described in detail in the foregoing and will not be repeated herein.

An embodiment of the present disclosure also provides a display device including the display panel as described above. The display device may be a display device for a mobile phone, a tablet computer, or a television.

Those skilled in the art may easily conceive of other embodiments of the present disclosure upon consideration of the specification and practice of the invention disclosed herein. The present disclosure is intended to cover any variations, uses, or adaptations of the present disclosure that follow the general principles of the present disclosure and include the common general knowledge or conventional technical means in the technical field not disclosed by the present disclosure. The specification and embodiments are to be regarded as exemplary only, with the true scope and spirit of the present disclosure being indicated by the following claims.

It is to be understood that the present disclosure is not limited to the precise structures described above and illustrated in the accompanying drawings, and that various modifications and changes may be made without departing from the scope thereof. The scope of the present disclosure is limited only by the appended claims.

What is claimed is:

1. A display panel, comprising:

a plurality of pixel driving circuits, comprising:

a driving circuit, connected to a first node, a second node, and a third node, and configured to input, in response to a signal from the first node, a driving current to the third node through the second node, and a first switching unit, having a first terminal connected to the third node and a second terminal connected to a sensing signal terminal, and configured to electrically connect, in response to a signal at a control terminal of the first switching unit, the third node and the sensing signal terminal; and a first gate driving circuit, comprising a plurality of first output terminals, the first output terminal being provided to correspond to the pixel driving circuit, and being connected to the control terminal of the first switching unit in the pixel driving circuit corresponding to the first output terminal, wherein a driving cycle of the pixel driving circuit comprises a data writing stage, a plurality of light-emitting stages, and a black frame insertion stage provided between adjacent light-emitting stages, and the first output terminal is configured to output an active level pulse during the data writing stage and the black frame insertion stage of the pixel driving circuit corresponding to the first output terminal, wherein the first gate driving circuit comprises a plurality of first shift register units in cascade connection, and the first shift register unit comprises:

a first input circuit, connected to a first power supply terminal, a first clock signal terminal, a fourth node, a fifth node, a second clock signal terminal, and configured to transmit, in response to a signal from the first clock signal terminal, a signal from the first power supply terminal to the fourth node, and transmit, in response to a signal from the fourth node, a signal from the second clock signal terminal to the fifth node;

a second input circuit, connected to the first power supply terminal, the first clock signal terminal, a first signal input terminal, a second power supply terminal and a sixth node, and configured to transmit, in response to the signal from the first clock signal terminal, the signal from the first power supply terminal to the sixth node, and transmit, in response to a signal from the first signal input terminal and the signal from the first clock signal terminal, a signal from the second power supply terminal to the sixth node;

a first output circuit, connected to the sixth node, a seventh node, the first power supply terminal, a first signal output terminal and the second power supply terminal, and configured to transmit, in response to a signal from the sixth node, the signal from the second power supply terminal to the first signal output terminal, and transmit, in response to a signal from the seventh node, the signal from the first power supply terminal to the first signal output terminal, wherein the seventh node is connected to the fifth node;

a first pull-down circuit, connected to the seventh node, the sixth node, the second power supply terminal and the fourth node, and configured to transmit, in response to the signal from the sixth node, the signal from the second power supply terminal to the seventh node and the fourth node; and a second pull-down circuit, connected to the fourth node, the sixth node, the second clock signal terminal and the second power supply terminal, and configured to transmit, in response to the signal from the fourth node and the signal from the second clock signal terminal, the signal from the second power supply terminal to the sixth node, and wherein the first signal output terminal of the first shift register unit forms the first output terminal of the first gate driving circuit.

2. The display panel according to claim 1, wherein the driving circuit comprises:

a driving transistor, having a first electrode connected to the second node, a second electrode connected to the third node, and a gate electrode connected to the first node, the first switching unit comprises:

a first transistor, having a first electrode connected to the third node, a second electrode connected to the sensing signal terminal, and a gate electrode connected to a first gate driving signal terminal, the pixel driving circuit further comprises:

a second transistor, having a first electrode connected to the first node, a second electrode connected to a data signal terminal, and a gate electrode connected to a second gate driving signal terminal; and a capacitor, connected between the first node and the third node.

3. The display panel according to claim 1, wherein the first shift register unit further comprises:

an isolating circuit, connected to the fifth node, the seventh node and the second clock signal terminal, and configured to electrically connect, in response to the signal from the second clock signal terminal, the fifth node and the seventh node;

a first reset circuit, connected to the sixth node, the first power supply terminal and a first reset signal terminal, and configured to transmit, in response to a signal from the first reset signal terminal, the signal from the first power supply terminal to the sixth node.

4. The display panel according to claim 1, wherein the first input circuit comprises:

a third transistor, having a first electrode connected to the first power supply terminal, a second electrode connected to the fourth node, and a gate electrode connected to the first clock signal terminal;

a fourth transistor, having a first electrode connected to the second clock signal terminal, a second electrode connected to the fifth node, and a gate electrode connected to the fourth node; and a first capacitor, connected to the fourth node, the second input circuit comprises:

a fifth transistor, having a first electrode connected to the first power supply terminal and a gate electrode connected to the first clock signal terminal;

a sixth transistor, having a first electrode connected to a second electrode of the fifth transistor, a second electrode connected to the sixth node, and a gate electrode connected to the first clock signal terminal; and a seventh transistor, having a first electrode connected to the second power supply terminal, a second electrode connected to the second electrode of the fifth transistor, and a gate electrode connected to the first signal input terminal.

5. The display panel according to claim 1, wherein the first output circuit comprises:

an eighth transistor, having a first electrode connected to the first power supply terminal, a second electrode connected to the first signal output terminal, and a gate electrode connected to the seventh node;

a second capacitor, connected to the seventh node;

a ninth transistor, having a first electrode connected to the second power supply terminal, a second electrode connected to the first signal output terminal, and a gate electrode connected to the sixth node; and a third capacitor, connected to the sixth node.

6. The display panel according to claim 1, wherein the first pull-down circuit comprises:

a tenth transistor, having a first electrode connected to the seventh node, a second electrode connected to the second power supply terminal, and a gate electrode connected to the sixth node; and an eleventh transistor, having a first electrode connected to the fourth node, a second electrode connected to the second power supply terminal, and a gate electrode connected to the sixth node, the second pull-down circuit comprises:

a twelfth transistor, having a first electrode connected to the second power supply terminal and a gate electrode connected to the fourth node; and a thirteenth transistor, having a first electrode connected to a second electrode of the twelfth transistor, a second electrode connected to the sixth node and a gate electrode connected to the second clock signal terminal.

7. The display panel according to claim 3, wherein the isolating circuit comprises:

a fourteenth transistor, having a first electrode connected to the fifth node, a second electrode connected to the seventh node, and a gate electrode connected to the second clock signal terminal, and the first reset circuit comprises:

a fifteenth transistor, having a first electrode connected to the first power supply terminal, a second electrode connected to the sixth node, and a gate electrode connected to the first reset signal terminal.

8. The display panel according to claim 1, wherein the pixel driving circuit further comprises:

a second transistor, having a first electrode connected to the first node, and a second electrode connected to a data signal terminal, the display panel further comprises:

a second gate driving circuit, comprising a plurality of second output terminals, the second output terminal being provided to correspond to the pixel driving circuit, and the second output terminal being connected to a gate electrode of the second transistor in the pixel driving circuit corresponding to the second output terminal, the second output terminal is configured to output the active level pulse during the data writing stage of the pixel driving circuit corresponding to the second output terminal.

9. The display panel according to claim 8, wherein a frame of the display panel comprises a blank time period, and during the blank time period of the frame, at least a portion of the pixel driving circuit is in a sensing stage, and the sensing stage of the pixel driving circuit comprises a sensing signal writing stage, a charging stage, a sampling stage, and a data signal writing back stage, the second output terminal corresponding to the pixel driving circuit which is in the sensing stage is further configured to respectively output the active level pulse during the sensing signal writing stage and the data signal writing back stage of the pixel driving circuit, and the first output terminal corresponding to the pixel driving circuit which is in the sensing stage is further configured to output the active level pulse in the sensing stage of the pixel driving circuit.

10. The display panel according to claim 9, wherein the second gate driving circuit comprises a plurality of second shift register units in cascade connection, and the second shift register unit comprises:

a second output circuit, connected to an eighth node, a second signal output terminal and a third clock signal terminal, and configured to transmit, in response to a signal from the eighth node, a signal from the third clock signal terminal to the second signal output terminal, wherein the second signal output terminal of the second shift register unit is configured to form the second output terminal of the second gate driving circuit; and a first control circuit, connected to the eighth node, a fourth clock signal terminal, the second signal output terminal, a tenth node, an eleventh node, and a first control signal terminal, and configured to transmit, in response to a signal from the first control signal terminal, a signal from the second signal output terminal to the tenth node, transmit, in response to a signal from the tenth node, a signal from the fourth clock signal terminal to the eleventh node, and transmit, in response to the signal from the fourth clock signal terminal, a signal from the eleventh node to the eighth node, the first shift register unit further comprises:

a second control circuit, connected to the eleventh node, the fourth clock signal terminal and the fourth node in the second shift register unit corresponding to the second control circuit, and configured to transmit, in response to the signal from the fourth clock signal terminal, the signal from the eleventh node to the fourth node, wherein the second shift register unit and the first shift register unit corresponding to the same the pixel driving circuit correspond to each other, and the second shift register unit corresponds to the second control circuit in the first shift register unit corresponding to the second shift register unit.

11. The display panel according to claim 10, wherein the second shift register unit further comprises:

a third input circuit, connected to a third power supply terminal, the eighth node and a second signal input terminal, and configured to transmit, in response to a signal from the second signal input terminal, a signal from the third power supply terminal to the eighth node;

a third pull-down circuit, connected to the third power supply terminal, the eighth node, a fourth power supply terminal, a ninth node and the second signal output terminal, and configured to transmit, in response to the signal from the third power supply terminal, the signal from the third power supply terminal to the ninth node, and transmit, in response to a signal from the ninth node, a signal from the fourth power supply terminal to the second signal output terminal and the eighth node;

a fourth pull-down circuit, connected to the eighth node, the fourth power supply terminal, and the ninth node, and configured to transmit, in response to the signal from the eighth node, the signal from the fourth power supply terminal to the ninth node;

a second reset circuit, connected to the eighth node, the fourth power supply terminal, and a second reset signal terminal, and configured to transmit, in response to information from the second reset signal terminal, the signal from the fourth power supply terminal to the eighth node; and a third reset circuit, connected to the eighth node, the fourth power supply terminal and a third reset signal terminal, and configured to transmit, in response to a signal from the third reset signal terminal, the signal from the fourth power supply terminal to the eighth node.

12. The display panel according to claim 11, wherein the third input circuit comprises:

a sixteenth transistor, having a first electrode connected to the third power supply terminal, a second electrode connected to the eighth node, and a gate electrode connected to the second signal input terminal, the third reset circuit comprises:

a seventeenth transistor, having a first electrode connected to the fourth power supply terminal, a second electrode connected to the eighth node, and a gate electrode connected to the third reset signal terminal, the second output circuit comprises:

an eighteenth transistor, having a first electrode connected to the third clock signal terminal, a second electrode connected to the second signal output terminal, and a gate electrode connected to the eighth node; and a fourth capacitor, connected to the eighth node, the third pull-down circuit comprises:

a nineteenth transistor, having a first electrode connected to the third power supply terminal, a second electrode connected to the ninth node, and a gate electrode connected to the third power supply terminal;

a twentieth transistor, having a first electrode connected to the eighth node, a second electrode connected to the fourth power supply terminal, and a gate electrode connected to the ninth node; and a twenty-seventh transistor, having a first electrode connected to the fourth power supply terminal, a second electrode connected to the second signal output terminal, and a gate electrode connected to the ninth node, the fourth pull-down circuit comprises:

a twenty-first transistor, having a first electrode connected to the ninth node, a second electrode connected to the fourth power supply terminal, and a gate electrode connected to the eighth node, and the second reset circuit comprises:

a twenty-second transistor, having a first electrode connected to the fourth power supply terminal, a second electrode connected to the eighth node, and a gate electrode connected to the second reset signal terminal.

13. The display panel according to claim 10, wherein the first control circuit comprises:

a twenty-third transistor, having a first electrode connected to the second signal output terminal, a second electrode connected to the tenth node, and a gate electrode connected to the first control signal terminal;

a twenty-fourth transistor, having a first electrode connected to the fourth clock signal terminal, a second electrode connected to the eleventh node, and a gate electrode connected to the tenth node;

a twenty-fifth transistor, having a first electrode connected to the eleventh node, a second electrode connected to the eighth node, and a gate electrode connected to the fourth clock signal terminal; and a fifth capacitor, connected to the tenth node.

14. The display panel according to claim 10, wherein the second control circuit comprises:

a twenty-sixth transistor, having a first electrode connected to the eleventh node, a second electrode connected to the fourth node, and a gate electrode connected to the fourth clock signal terminal.

15. The display panel according to claim 11, wherein the first power supply terminal and the third power supply terminal share a same power supply terminal, and the second power supply terminal and the fourth power supply terminal share a same power supply terminal.

16. The display panel according to claim 1, wherein the display panel further comprises:

a first clock signal line, connected to the first clock signal terminal of the first shift register unit in an odd cascade and the second clock signal terminal of the first shift register unit in an even cascade; and a second clock signal line connected to the second clock signal terminal of the first shift register unit in the odd cascade and the first clock signal terminal of the first shift register unit in the even cascade.

17. The display panel according to claim 10, wherein the display panel further comprises:

a fourth clock signal line, connected to the fourth clock signal terminal in each of the first shift register units; and a reset signal line, connected to the first reset signal terminal in each of the first shift register units and the second reset signal terminal in each of the second shift register units.

18. A method for driving the display panel according to claim 9, comprising:

outputting the active level pulse through the first output terminal during the data writing stage, the black frame insertion stage, and the sensing stage of the pixel driving circuit corresponding to the first output terminal; and outputting the active level pulse through the second output terminal during the data writing stage, the sensing signal writing stage, and the data signal writing back stage of the pixel driving circuit corresponding to the second output terminal.

19. A display device comprising the display panel according to claim 1.

* * * * *